United States Patent
Ohkawa et al.

(10) Patent No.: US 8,223,112 B2
(45) Date of Patent: Jul. 17, 2012

(54) SHIFT REGISTER RECEIVING ALL-ON SIGNAL AND DISPLAY DEVICE

(75) Inventors: Hiroyuki Ohkawa, Osaka (JP); Shige Furuta, Osaka (JP); Yasushi Sasaki, Osaka (JP); Yuhichiroh Murakami, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

(21) Appl. No.: 12/734,234

(22) PCT Filed: Aug. 18, 2008

(86) PCT No.: PCT/JP2008/064703
§ 371 (c)(1),
(2), (4) Date: Apr. 20, 2010

(87) PCT Pub. No.: WO2009/084267
PCT Pub. Date: Jul. 9, 2009

(65) Prior Publication Data
US 2010/0259525 A1    Oct. 14, 2010

(30) Foreign Application Priority Data
Dec. 27, 2007 (JP) .................. 2007-336235

(51) Int. Cl.
*G09G 3/36* (2006.01)
*G09G 5/00* (2006.01)
*G06F 3/038* (2006.01)
(52) U.S. Cl. ............ 345/100; 345/98; 345/204
(58) Field of Classification Search .......... 345/100, 345/204
See application file for complete search history.

(56) References Cited

U.S. PATENT DOCUMENTS
5,248,963 A    9/1993    Yasui et al.
6,559,824 B1   5/2003    Kubota et al.
(Continued)

FOREIGN PATENT DOCUMENTS
EP    2 189 987    5/2010
(Continued)

OTHER PUBLICATIONS
International Search Report.
(Continued)

*Primary Examiner* — Bipin Shalwala
*Assistant Examiner* — Ryan A Lubit
(74) *Attorney, Agent, or Firm* — Harness, Dickey & Pierce, P.L.C.

(57) ABSTRACT

At least one embodiment of the present invention is directed to, even when external noise is applied to a shift register during all-on operation, preventing through-current from flowing in unit circuits and also to prevent increase in load on all-on control signal lines. When a high-level all-on control signal is provided to a unit circuit of a shift register, a transistor $T_3$ is brought into off-state, so that a transistor $T_2$ cannot output an on-voltage to a first output terminal. However, a transistor $T_{24}$ is brought into on-state, so that the first output terminal outputs an on-voltage to the exterior. On the other hand, a transistor $T_{32}$ is brought into on-state, so that a second output terminal outputs an off-voltage to a unit circuit 11 in the next stage. At this time, the transistor $T_3$ is kept in off-state, so that no through-current flows to the transistors $T_{24}$ and $T_3$.

11 Claims, 20 Drawing Sheets

U.S. PATENT DOCUMENTS

| | | |
|---|---|---|
| 2001/0009411 A1 | 7/2001 | Kusanagi |
| 2007/0195053 A1* | 8/2007 | Tobita et al. .................. 345/100 |
| 2008/0246739 A1* | 10/2008 | Choi et al. .................... 345/206 |
| 2008/0284698 A1* | 11/2008 | Lee et al. ...................... 345/204 |
| 2009/0121998 A1* | 5/2009 | Ohkawa et al. ............... 345/100 |

FOREIGN PATENT DOCUMENTS

| | | |
|---|---|---|
| JP | 02-272490 | 11/1990 |
| JP | 2001-159877 | 6/2001 |
| JP | 2001-209355 | 8/2001 |
| JP | 2002-197885 | 7/2002 |
| JP | 2005-123865 | 5/2005 |
| JP | 2005-149624 | 6/2005 |
| JP | 2007-257812 | 10/2007 |
| JP | 2007-286266 | 11/2007 |
| WO | WO 89/06416 | 7/1989 |
| WO | WO 2007/108177 | 9/2007 |

OTHER PUBLICATIONS

Supplementary European Search Report for European application No. 08 86 7875 dated Nov. 29, 2010.

* cited by examiner

FIG. 3

|  | IN | CK | CKB | N1 | N2 | AON | AONB | OUT1 | OUT2 |
|---|---|---|---|---|---|---|---|---|---|
| ALL-ON | H | H | H | L | H | H | L | — | — |
|  | H | H | L | L | H |  |  | — | — |
|  | H | L | H | L | H |  |  | — | — |
|  | H | L | L | L | H |  |  | — | — |
|  | L | H | H | L | H |  |  | H | L |
|  | L | H | L | L | H |  |  | H | L |
|  | L | L | H | L | H |  |  | H | L |
|  | L | L | L | L | H |  |  | H | L |
| NORMAL | H | H | H | x | x | L | H | x | x |
|  | H | H | L | H | L |  |  | H | H |
|  | H | L | H | H | L |  |  | L | L |
|  | H | L | L | H | L |  |  | L | L |
|  | L | H | H | L | H |  |  | L | L |
|  | L | H | L | L | H |  |  | L | L |
|  | L | H | L | H | L |  |  | H | H |
|  | L | L | H | L | H |  |  | L | L |
|  | L | L | H | H | L |  |  | L | L |
|  | L | L | L | L | H |  |  | L | L |
|  | L | L | L | H | L |  |  | L | L |

FIG. 7

|  | IN | CK | CKB | N1 | N2 | AON | AONB | OUT1 | OUT2 |
|---|---|---|---|---|---|---|---|---|---|
| ALL-ON | H | H | H | L | H | H | L | H | L |
|  | H | H | L | L | H |  |  | H | L |
|  | H | L | H | L | H |  |  | H | L |
|  | H | L | L | L | H |  |  | H | L |
|  | L | H | H | L | H |  |  | H | L |
|  | L | H | L | L | H |  |  | H | L |
|  | L | L | H | L | H |  |  | H | L |
|  | L | L | L | L | H |  |  | H | L |
| NORMAL | H | H | H | x | x | L | H | x | x |
|  | H | H | L | H | L |  |  | H | H |
|  | H | L | H | H | L |  |  | L | L |
|  | H | L | L | H | L |  |  | L | L |
|  | L | H | H | L | H |  |  | L | L |
|  | L | H | L | L | H |  |  | L | L |
|  |  |  |  | H | L |  |  | H | H |
|  | L | L | H | L | H |  |  | L | L |
|  |  |  |  | H | L |  |  | L | L |
|  | L | L | L | L | H |  |  | L | L |
|  |  |  |  | H | L |  |  | L | L |

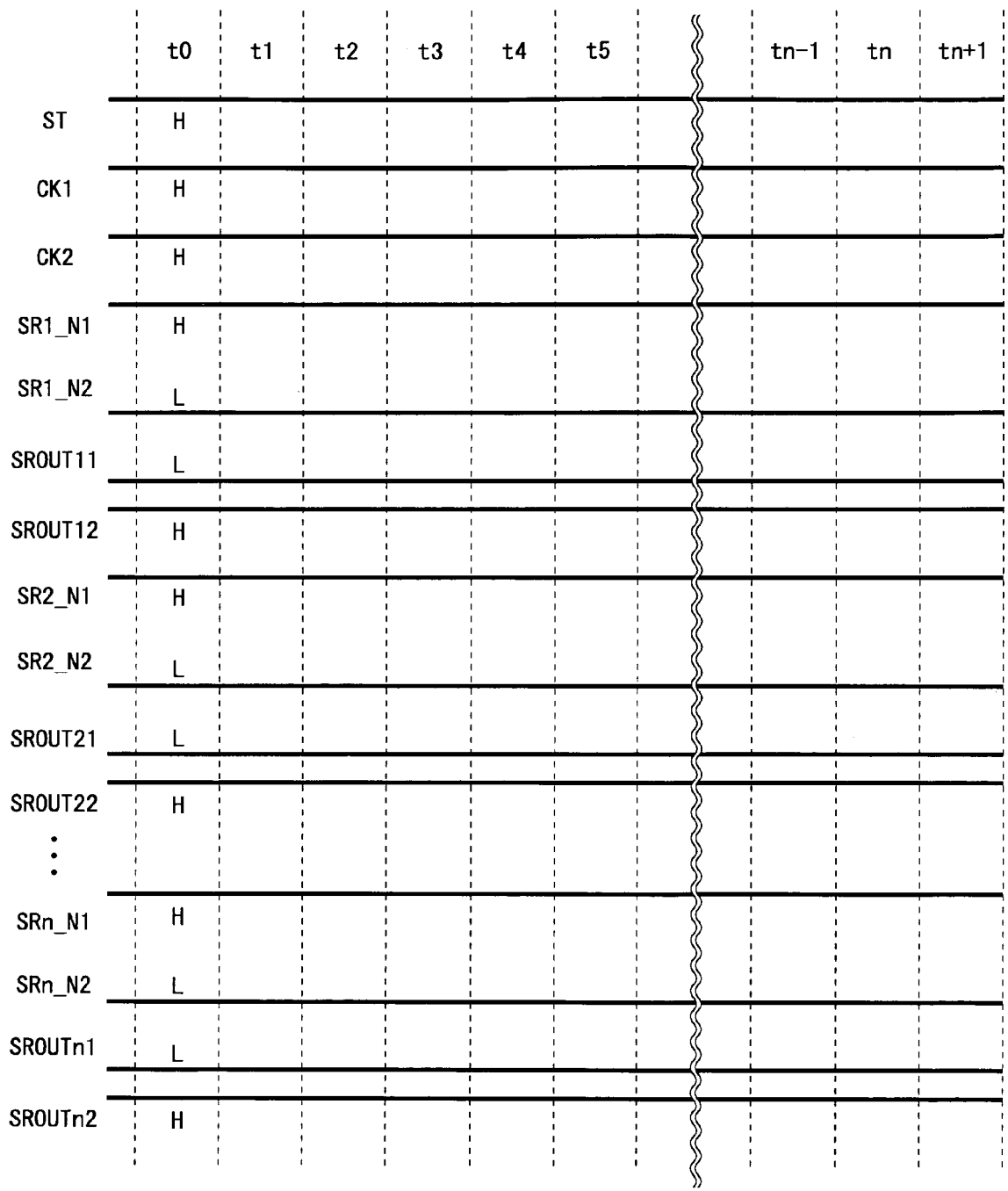
F I G. 1 3

SHIFT REGISTER RECEIVING ALL-ON SIGNAL AND DISPLAY DEVICE

TECHNICAL FIELD

The present invention relates to shift registers and display devices, and particularly the invention relates to a shift register preferably used for a driver circuit of a display device or an imaging device as well as to a display device or an imaging device using such a shift register.

BACKGROUND ART

Active-matrix display devices display video by selecting two-dimensionally arranged display elements row by row, and writing a voltage to the selected display elements in accordance with data to be displayed. To select display elements row by row, a shift register for sequentially shifting output signals based on clock signals is used as a scanning signal line driver circuit. Also, as for display devices in which dot-sequential drive is performed, a similar shift register is provided in a data signal line driver circuit.

For some liquid crystal display devices, a production process intended to form TFTs (Thin Film Transistors) in display elements is used for forming a display element driver circuit integrally with display elements. In such a case, to reduce production cost, a driver circuit including a shift register is preferably formed using transistors of the same conductivity type as TFTs. Also, increasing the number of clock signals to be provided to the shift register results in an increased area for laying out clock wires and increased power consumption. Given such a background, the shift register is required to operate based on two-phase clock signals using transistors of the same conductivity type. When such a shift register is used in a liquid crystal display device, video disturbance caused by turning on or off the power circuit of the liquid crystal display device might be visible to the human eye, so that viewers experience a feeling of discomfort.

Therefore, if it is possible to perform all-on operation, which allows all output terminals of the shift register to output high-level output signals, when the power circuit is turned on, disturbance of video displayed on the screen can be alleviated. A known shift register capable of such all-on operation is described in Japanese Laid-Open Patent Publication No. 2002-197885.

FIG. 21 is a circuit diagram of a signal retention block included in the shift register described in Japanese Laid-Open Patent Publication No. 2002-197885. The operation of the signal retention block shown in FIG. 21 will be described. All transistors included in the signal retention block are of N-channel type. When the shift register performs all-on operation, transistors $T_{11}$, $T_{12}$, and $T_{13}$ are brought into off state. Also, a power-supply voltage VDD is provided to a drain terminal of a diode-connected transistor $T_{16}$, so that the potential of a node NB is set to high level, thereby bringing a transistor $T_{14}$ into on-state. Accordingly, when an output control signal SET at a level of $V_a$ (high level) is externally provided to a control terminal CTL, the potential of a node $N_{out}$ is set to $(V_a-V_{th})$ (where $V_{th}$ is a threshold voltage of the transistor $T_{14}$). As a result, an output signal $OT_k$ at a potential level of $(V_a-V_{th})$ is outputted from an output terminal OUT. In other signal retention blocks, similarly, high-level output signals are outputted simultaneously. Therefore, a shift register configured by such signal retention blocks can perform all-on operation.

[Patent Document 1] Japanese Laid-Open Patent Publication No. 2002-197885

DISCLOSURE OF THE INVENTION

Problems to be Solved by the Invention

In the above conventional circuit, however, the transistor $T_{13}$ might be brought into on-state when external noise is applied during normal operation. At this time, through-current flows to the transistors $T_{13}$ and $T_{14}$, causing a problem where power consumption of the power supply for driving the shift register increases. Also, the control terminal CTL is connected from the output terminal OUT to a scanning signal line of a liquid crystal display panel via the transistor $T_{14}$, and therefore a problem is caused where load on an output control signal line increases.

Therefore, an objective of the present invention is to provide a shift register in which no through-current flows in unit circuits and load on all-on control signal lines does not increase.

Solution to the Problems

A first aspect of the present invention is directed to a shift register configured by connecting unit circuits in multiple stages and operating based on two-phase clock signals, including first and second clock signals, the unit circuits being configured by transistors of the same conductivity type, wherein, each of the unit circuits includes:
a first output terminal for externally outputting a first output signal;
a second output terminal for outputting a second output signal to an input terminal of a subsequent-stage unit circuit;
a first output signal generation circuit for outputting either an on- or off-voltage to the first output terminal as the first output signal;
a second output signal generation circuit for outputting either an on- or off-voltage to the second output terminal as the second output signal; and
an all-on output signal generation circuit for outputting an on-voltage to the first output terminal as the first output signal, and when an active all-on control signal is provided to the unit circuit, the first output signal generation circuit stops outputting the on-voltage as the first output signal at the same time as the all-on output signal generation circuit outputs the on-voltage to the first output terminal as the first output signal and the second output signal generation circuit outputs the off-voltage to the second output terminal as the second output signal.

In a second aspect of the present invention, based on the first aspect of the invention, the first output signal generation circuit includes:
a first output control transistor having the first clock signal provided to a first conducting terminal and connected at a second conducting terminal to the first output terminal; and
a first output reset transistor connected at a first conducting terminal to the second conducting terminal of the first output control transistor and having an off-voltage provided to a second conducting terminal,
the second output signal generation circuit includes:

a second output control transistor having the first clock signal provided to a first conducting terminal and connected at a second conducting terminal to the second output terminal; and a second output reset transistor connected at a first conducting terminal to the second conducting terminal of the second output control transistor and having an off-voltage provided to a second conducting terminal, the all-on output signal generation circuit includes a third output control transistor having an on-voltage provided to a first conducting terminal and connected at a second conducting terminal to the first output terminal, and when the active all-on control signal is provided to the unit circuit, the first and second output control transistors and the first output reset transistor have an off-voltage provided to their control terminals and are brought into off-state, and the second output reset transistor and the third output control transistor have an on-voltage provided to their control terminals and are brought into on-state.

In a third aspect of the present invention, based on the second aspect of the invention, the shift register further comprises:

a reset signal output transistor having an on-voltage provided to a first conducting terminal and the all-on control signal provided to a control terminal and providing a voltage at a second conducting terminal to the control terminal of the second output reset transistor as a reset signal; and a discharge circuit for providing an off-voltage to the control terminals of the first and second output control transistors while the reset signal is an on-voltage.

In a fourth aspect of the present invention, based on the second aspect of the invention, the shift register further comprises:

a reset signal generation circuit for generating a reset signal so as to change to an on-voltage when the second output signal from a previous-stage unit circuit is an off-voltage and change to an off-voltage when the second output signal from the previous-stage unit circuit transitions to an on-voltage;

a discharge circuit for providing an off-voltage to the control terminals of the first and second output control transistors while the reset signal is an on-voltage;

a reset signal block transistor having a signal inverted from the all-on control signal provided to a control terminal and connected at a first conducting terminal to the reset signal generation circuit and at a second conducting terminal to the control terminal of the first output reset transistor; and an off-voltage supply transistor having the all-on control signal provided to a control terminal and an off-voltage provided to a first conducting terminal and connected at a second conducting terminal to the control terminal of the first output reset transistor.

In a fifth aspect of the present invention, based on the second aspect of the invention, the unit circuit further includes an input signal control circuit for, when provided with the active all-on control signal, blocking an input signal provided by a previous-stage unit circuit and providing an off-voltage to an input terminal for receiving the input signal.

In a sixth aspect of the present invention, based on the second aspect of the invention, the shift register further comprises:

a reset signal generation circuit for generating a reset signal so as to change to an on-voltage when the second output signal from a previous-stage unit circuit is an off-voltage and change to an off-voltage when the second output signal from the previous-stage unit circuit transitions to an on-voltage; and a discharge circuit for providing an off-voltage to the control terminals of the first and second output control transistors while the reset signal is an on-voltage, wherein, the reset signal generation circuit includes:

a resistive element having an on-voltage provided to a first terminal;

a first transistor having the second clock signal provided to a control terminal and connected at a first conducting terminal to a second terminal of the resistive element; and a second transistor having an input signal from the previous-stage unit circuit provided to a control terminal, connected at a first conducting terminal to the second conducting terminal of the first transistor, and having an off-voltage provided to a second conducting terminal, and the reset signal generation circuit outputs a voltage at a connection point between the first transistor and the second transistor as the reset signal.

A seventh aspect of the present invention is directed to a display device comprising a plurality of two-dimensionally arranged display elements and a driver circuit including a shift register of any of the first to sixth aspects of the invention, wherein the display elements and the shift register are configured by transistors of the same conductivity type.

An eighth aspect of the present invention is directed to an active-matrix display device for providing video to be displayed, comprising:

a display portion including a plurality of scanning signal lines, a plurality of data signal lines crossing the scanning signal lines, and a plurality of display elements arranged in a matrix at their corresponding intersections of the scanning signal lines and the data signal lines;

a scanning signal line driver circuit including a shift register of any of the first to sixth aspects of the invention and selectively activating the scanning signal lines;

a video signal line for transmitting a video signal for the video to be displayed to the display portion;

a data signal line driver circuit for outputting a data signal to the data signal lines based on the video signal transmitted by the video signal line; and a power circuit for supplying a power-supply voltage to the scanning signal line driver circuit and the data signal line driver circuit, wherein, when the power circuit is turned on, an active all-on control signal is provided to the scanning signal line driver circuit, thereby activating all the scanning signal lines.

In a ninth aspect of the present invention, based on the eighth aspect of the invention, the data signal line driver circuit includes a shift register of any of the first to sixth aspects of the invention, and when the power circuit is turned on, the active all-on control signal is provided to the data signal line driver circuit, thereby providing an equal voltage to all the data signal lines.

In a tenth aspect of the present invention, based on the eighth aspect of the invention, the data signal line driver circuit further includes a shift register of any of the first to sixth aspects of the invention and a plurality of switching elements connecting the video signal line to each of the data signal lines, and when the power circuit is turned off, the active all-on control signal is provided to the data signal line driver circuit, thereby turning off all the switching elements.

In an eleventh aspect of the present invention, based on the eighth aspect of the invention, the data signal line driver circuit further includes a shift register of any of the first to sixth aspects of the invention and a plurality of switching elements connecting the video signal line to each of the data signal lines, and when the power circuit is turned off, the active all-on control signal is provided to the data signal line driver circuit, thereby turning on all the switching elements.

In a twelfth aspect of the present invention, based on the eighth aspect of the invention, a capacitative element is connected between an output terminal of the power circuit and a ground terminal.

Effect of the Invention

According to the first aspect of the invention, when the active all-on control signal is provided to the unit circuit, the first output signal generation circuit stops outputting the on-voltage as the first output signal at the same time as the all-on output signal generation circuit outputs the on-voltage to the first output terminal as the first output signal. Also, the second output signal generation circuit outputs the off-voltage to the second output terminal as the second output signal. In this manner, during all-on operation, the shift register can output the on-voltage to the first output terminal as the first output signal and the off-voltage to the second output terminal as the second output signal.

According to the second aspect of the invention, when the active all-on control signal is provided to the unit circuit, the first output control transistor, the second output control transistor, and the first output reset transistor are brought into off-state. On the other hand, the second output reset transistor and the third output control transistor are brought into on-state. As a result, when the shift register performs all-on operation, no through-current flows from the third output control transistor to the first output reset transistor. Also, regardless of the levels of the clock signals, no through-current flows from the third output control transistor to the first output control transistor. Furthermore, the all-on control signal is provided to the control terminal of the third output control transistor, and therefore all-on control terminals are not directly connected to any external circuit. Thus, load on the all-on control signal lines can be reduced. Also, during normal operation, when the first output reset transistor is brought into on-state, the same off-voltage is provided to the second conducting terminal and the control terminal of the first output control transistor. At this time, no potential difference occurs between the second conducting terminal and the control terminal of the first output control transistor even when the value of the off-voltage varies due to the power circuit being affected by noise, and therefore the first output control transistor is not brought into on-state. Thus, no through-current flows from the first output control transistor to the first output reset transistor.

According to the third aspect of the invention, when the all-on control signal is provided to the control terminal of the reset signal output transistor, the reset signal output transistor provides the on-voltage to the control terminal of the second output reset transistor as the reset signal. On the other hand, the discharge circuit provides an off-voltage to the control terminals of the first and second output control transistors while the reset signal is an on-voltage. Therefore, when the all-on control signal is provided to the unit circuit, the second output reset transistor is brought into on-state, so that the off-voltage is outputted to the second output terminal as the second output signal, and the first and second output control transistors are brought into off-state, so that the first output signal is stopped from being outputted. In addition, the all-on control signal is also provided to the control terminal of the reset signal output transistor, and therefore all-on control terminals are not directly connected to any external circuit. Thus, load on the all-on control signal lines can be reduced.

According to the fourth aspect of the invention, in order not to provide the on-voltage, which is outputted by the reset signal generation circuit as the reset signal, to the control terminal of the first output reset transistor, the reset signal block transistor shuts off the reset signal generation circuit and the control terminal of the first output reset transistor. The off-voltage supply transistor provides an off-voltage to the control terminal of the first output reset transistor. Also, the discharge circuit provides an off-voltage to the control terminals of the first and second output control transistors while the reset signal is an on-voltage. Therefore, during all-on operation, the first output control transistor, the second output control transistor, and the first output reset transistor can be stopped from outputting the first or second output signal. Also, when returning from all-on operation to normal operation, an on-voltage is provided to the control terminal of the reset signal block transistor, and an off-voltage is provided to the control terminal of the off-voltage supply transistor. As a result, the first output reset transistor is brought into on-state, so that the off-voltage is outputted to the first output terminal as the first output signal. Thus, when returning from all-on operation to normal operation, the shift register can return to normal operation more quickly because it is not necessary to perform initialization operation.

According to the fifth aspect of the invention, when the active all-on control signal is provided, the input signal control circuit blocks an input signal from a previous-stage unit circuit, and provides an off-voltage for an input terminal for receiving the input signal. Thus, the shift register can perform all-on operation regardless of the level of the input signal from the previous-stage unit circuit.

According to the sixth aspect of the invention, when the second clock signal is provided to the control terminal of the first transistor, thereby bringing the first transistor into on-state, the reset signal generation circuit can cause the reset signal to quickly rise from the off-voltage to the on-voltage.

According to the seventh aspect of the invention, by using a driver circuit including a shift register in which no through-current flows during both all-on operation and normal operation and load on all-on control signal lines is small, it is rendered possible to obtain a display device in which no through-current flows during both all-on operation and normal operation and load on all-on control signal lines is small.

According to the eighth aspect of the invention, when the power circuit is turned on, a plurality of scanning signal lines are activated, so that charges accumulated from conductive switching elements to display elements can be instantaneously released. Thus, disturbance of video displayed on the display portion when the power circuit is turned on can be reduced to such a degree as to be unperceivable to the human eye.

According to the ninth aspect of the invention, when the power circuit is turned on, an equal voltage is provided to a plurality of data signal lines. Thus, it is possible to prevent disturbance of video displayed on the display portion when the power circuit is turned on.

According to the tenth aspect of the invention, all switching elements are turned off when the power circuit is turned off, and therefore display elements connected to the same data signal line are rendered conductive to one another. Consequently, the display elements are rendered equal in charge state, making it possible to prevent disturbance of video displayed on the display portion when the power circuit is turned off.

According to the eleventh aspect of the invention, all switching elements are turned on when the power circuit is turned off, and therefore all display elements are rendered conductive to one another, so that the display elements are rendered equal in the state of charge accumulation therein. Thus, it is possible to prevent disturbance of video to be further displayed on the display portion.

According to the twelfth aspect of the invention, even when the power circuit is forcibly shut off, it is possible to prevent disturbance of video displayed on the display portion by performing all-on operation.

BRIEF DESCRIPTION OF THE DRAWINGS

FIG. 3 is a truth table for the unit circuit shown in FIG. 2.

FIG. 7 is a truth table for the unit circuit shown in FIG. 6.

FIG. 13 is a timing chart for all-on operation of the shift register having unit circuits as shown in FIG. 10 connected in multiple stages.

FIG. 18 is a timing chart for the liquid crystal display device shown in FIG. 16 where the power is on.

Figure 1:
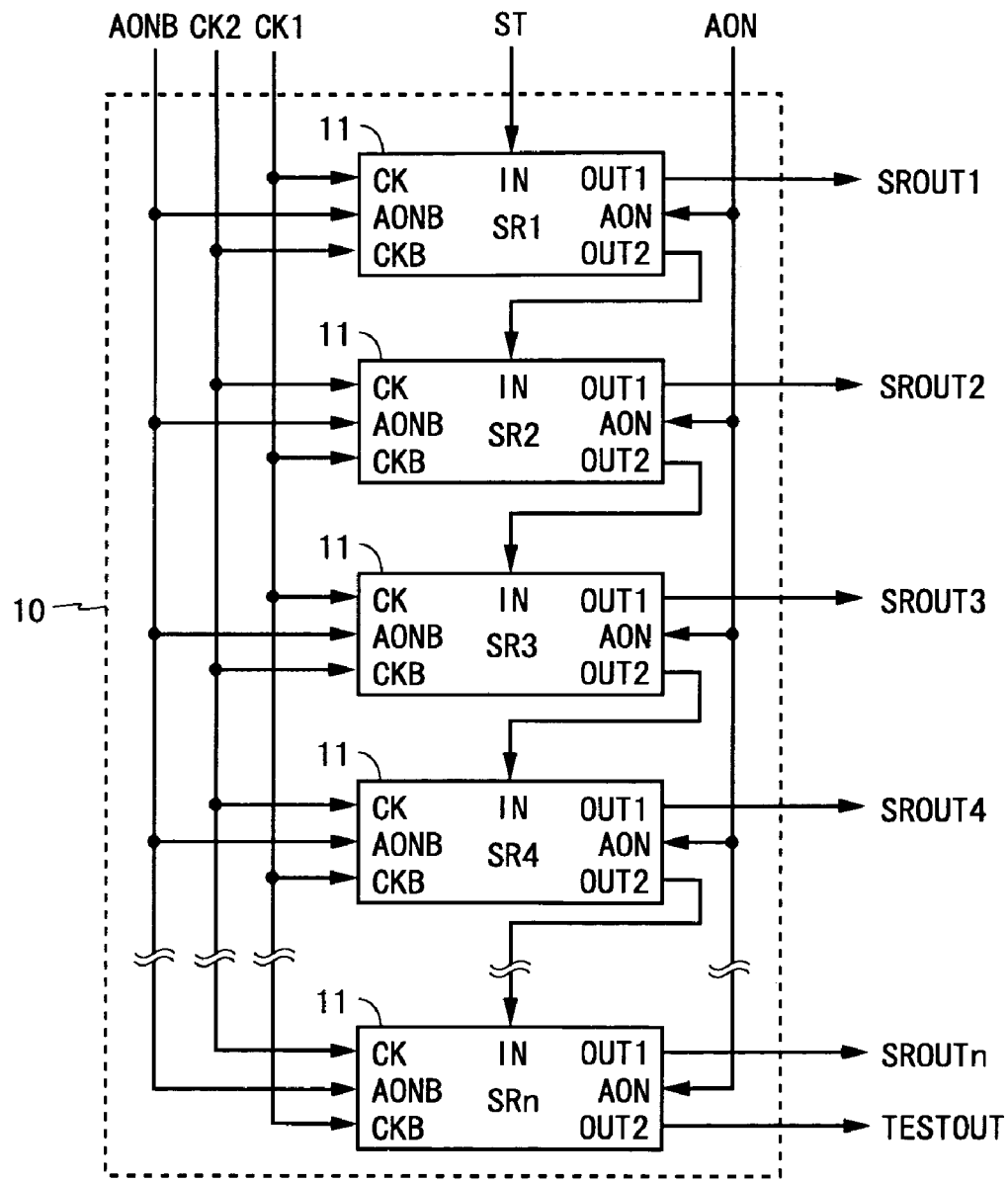
FIG. 1 is a block diagram illustrating the configuration of a shift register according to a first embodiment of the present invention.

DESCRIPTION OF THE REFERENCE CHARACTERS 10 shift register
11, 21, 31, 41 unit circuit
12 all-on output signal generation circuit
22 input signal control circuit
32 reset generation circuit
110, 120, 130 liquid crystal display device
111, 121, 131 display portion
113, 123, 133 scanning signal line driver circuit
114, 124, 134 data signal line driver circuit
136 power circuit
137 capacitative element

BEST MODE FOR CARRYING OUT THE INVENTION

<1. First Embodiment>

FIG. 1 is a block diagram illustrating the configuration of a shift register 10 according to a first embodiment of the present invention. The shift register 10 shown in FIG. 1 is configured by connecting n (where n is an integer of 2 or more) unit circuits 11 in multiple stages. Each of the unit circuits 11 has clock terminals CK and CKB, an input terminal IN, a first output terminal $OUT_1$, a second output terminal $OUT_2$, and all-on control terminals AON and AONB. Hereinafter, a signal which is inputted/outputted via a terminal is referred to by the same name as that terminal (e.g., a signal which is inputted via the clock terminal CK is referred to as a clock signal CK).

The shift register 10 is externally supplied with a start pulse ST, two-phase clock signals $CK_1$ and $CK_2$, and all-on control signals AON and AONB (negation to AON). The start pulse ST is provided to the input terminal IN of the first-stage unit circuit 11. The clock signal $CK_1$ is provided to the clock terminals CK of odd-numbered-stage unit circuits 11 and the clock terminals CKB of even-numbered-stage unit circuits 11 (the even numbers include zero; the same applies below). The clock signal $CK_2$ is provided to the clock terminals CKB of the odd-numbered-stage unit circuits 11 and the clock terminals CK of the even-numbered-stage unit circuits 11. The all-on control signals AON and AONB are provided to the all-on control terminals AON and AONB, respectively, of the unit circuits 11. First output signals $OUT_1$ from the unit circuits 11 are outputted to the exterior as output signals $SROUT_1$ to $SROUT_n$, and second output signals $OUT_2$ therefrom are provided to the input terminals IN of their respective subsequent-stage unit circuits 11.

Figure 2:
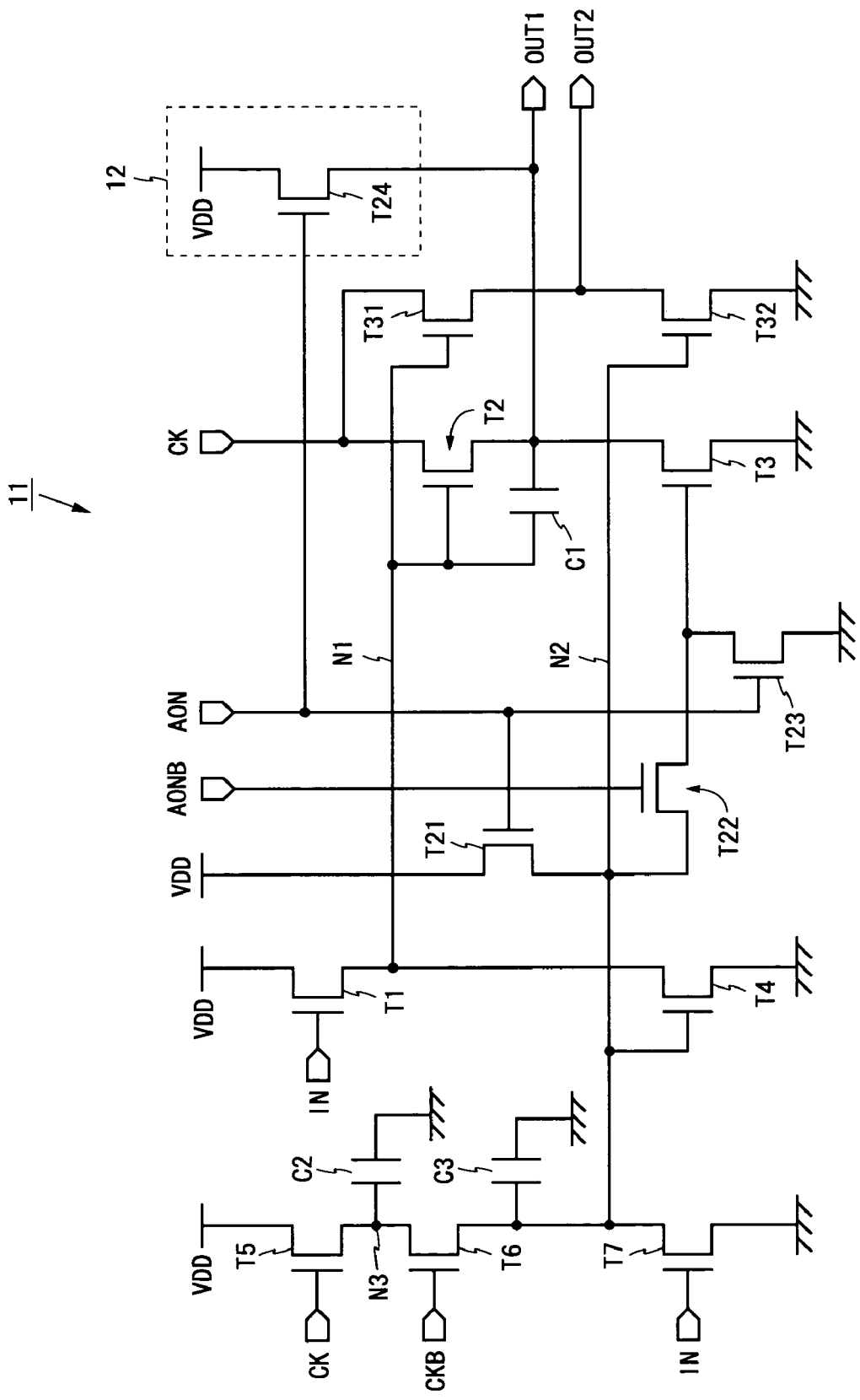
FIG. 2 is a circuit diagram of a unit circuit included in the shift register shown in FIG. 1.

FIG. 2 is a circuit diagram of the unit circuit 11 included in the shift register 10. As shown in FIG. 2, the unit circuit 11 is configured by transistors of the same conductivity type, including 13 N-channel transistors $T_1$ to $T_7$, $T_{21}$ to $T_{24}$, $T_{31}$ and $T_{32}$, and three capacitances $C_1$ to $C_3$. Hereinafter, a voltage (signal level) which brings a transistor into on-state when provided to its gate terminal is referred to as an on-voltage (on-level), while a voltage (signal level) which brings a transistor into off-state when provided to its gate terminal is referred to as an off-voltage (off-level). In the case of the N-channel transistor, a high voltage acts as an on-voltage (a high level corresponds to an on-level), and a low voltage acts as an off-voltage (a low level corresponds to an off level); the opposite is true for the P-channel transistor.

The transistor $T_1$ has a power-supply voltage VDD provided to a drain terminal and is connected at a gate terminal to the input terminal IN. The transistor $T_1$ is connected at a source terminal to a gate terminal of the transistor $T_2$ and a drain terminal of the transistor $T_4$. Hereinafter, the connection point is referred to as a node $N_1$. The transistor $T_2$ is connected at a drain terminal to the clock terminal CK and at a source terminal to the first output terminal $OUT_1$ and a drain terminal of the transistor $T_3$. The transistors $T_3$ and $T_4$ are grounded at their source terminals.

The transistor $T_{23}$ is connected at a drain terminal to a gate terminal of the transistor $T_3$ and at a gate terminal to the all-on control terminal AON, and is grounded at a source terminal. The transistor $T_{21}$ has the power-supply voltage VDD provided to a drain terminal, and is connected at a gate terminal to the all-on control terminal AON. The transistor $T_{21}$ is connected at a source terminal to a drain terminal of the transistor $T_{22}$, and the transistor $T_{22}$ is connected at a source terminal to the drain terminal of the transistor $T_{23}$ and the gate terminal of the transistor $T_3$. The transistor $T_{24}$ has the power-supply voltage VDD provided to a drain terminal, and is connected at a source terminal to the first output terminal $OUT_1$ and at a gate terminal to the all-on control terminal AON.

The transistor $T_{31}$ is connected at a gate terminal to the node $N_1$, at a drain terminal to the clock terminal CK, and at a source terminal to a drain terminal of the transistor $T_{32}$. The transistor $T_{32}$ is connected at a gate terminal to a node $N_2$, and is grounded at a source terminal. Also, the connection point between the source terminal of the transistor $T_{31}$ and the drain terminal of the transistor $T_{32}$ is connected to the second output terminal $OUT_2$.

The transistor $T_5$ has the power-supply voltage VDD provided to a drain terminal, and is connected at a source terminal to a drain terminal of the transistor $T_6$. The transistor $T_6$ is connected at a source terminal to a drain terminal of the transistor $T_7$, and the transistor $T_7$ is grounded at a source terminal. The transistors $T_5$ to $T_7$ are connected at their gate terminals to the clock terminals CK and CKB and the input terminal IN, respectively. The connection point between the transistors $T_6$ and $T_7$ is also connected to the gate terminals of the transistors $T_4$ and $T_{32}$. Hereinafter, the connection point is referred to as the node $N_2$, and the connection point between the transistors $T_5$ and $T_6$ is referred to as a node $N_3$.

The capacitances $C_1$ to $C_3$ are configured by capacitive elements. The capacitance $C_1$ is provided between the gate and source terminals of the transistor $T_2$, the capacitance $C_2$ is provided between the node $N_3$ and a ground terminal, and the capacitance $C_3$ is provided between the node $N_2$ and the ground terminal. The capacitance $C_1$ functions as a bootstrap capacitance, and the capacitances $C_2$ and $C_3$ function as charge-pump capacitances. The capacitance values of the capacitances $C_2$ and $C_3$ are assumed to be equal below.

When the all-on control signal AON is at high level, the transistor $T_{21}$ outputs a reset signal which provides ($VDD - V_{th}$) (where $V_{th}$ is a threshold voltage of the transistor $T_{21}$) to the gate terminal of the transistor $T_{32}$, thereby bringing the transistor $T_{32}$ into on-state. When the all-on control signal AON is at high level, the all-on control signal AONB is at low level, and therefore the transistor $T_{22}$ is brought into off state, blocking the reset signal to be provided to the gate terminal of the transistor $T_3$. The transistor $T_{23}$ has the all-on control signal AON provided to its gate terminal, and therefore provides an off-voltage to the gate terminal of the transistor $T_3$, thereby forcibly bringing the transistor $T_3$ into off state. On the other hand, when the all-on control signal AON is at high level, the transistor $T_{24}$ outputs a high-level first output signal $OUT_1$ to the first output terminal $OUT_1$.

In the unit circuit 11, the transistors $T_5$ to $T_7$ and the capacitances $C_2$ and $C_3$ form a reset signal generation circuit, the transistors $T_{21}$ to $T_{24}$ respectively function as a reset signal output transistor, a reset signal block transistor, an off-voltage supply transistor, and an all-on output signal generation circuit 12, and the transistor $T_4$ functions as a discharge circuit. Also, the transistors $T_2$, $T_{31}$, and $T_{24}$ respectively function as first, second, and third output control transistors, and the transistors $T_3$ and $T_{32}$ respectively function as first and second output reset transistors. The transistors $T_2$ and $T_3$ function together as a first output signal generation circuit, and the transistors $T_{31}$ and $T_{32}$ function together as a second output signal generation circuit.

FIG. 3 is a truth table illustrating the operation of the shift register 10. In this truth table, H denotes high level, and L denotes low level. Note that the truth table is simplified, so that H in the truth table encompasses cases where the level is lower than the power-supply voltage VDD by a threshold voltage of the transistor. As shown in FIG. 3, in addition to normal operation for sequentially outputting one high-level output signal at a time, the shift register 10 performs all-on operation for simultaneously outputting a high-level first output signal $OUT_1$ to all first output terminals $OUT_1$ and a low-level second output signal $OUT_2$ to all second output terminals $OUT_2$. Hereinafter, unless otherwise specified, potentials of signals inside the shift register 10 and input/output signals, including the clock signals $CK_1$ and $CK_2$, are at VDD when the signals are at high level and at VSS (zero) when they are at low level.

During all-on operation, when a low-level input signal IN, a high-level all-on control signal AON, and a low-level all-on control signal AONB are respectively inputted to the input terminal IN, the all-on control terminal AON, and the all-on control terminal AONB, the potentials of the nodes $N_1$ and $N_2$ are brought into low and high levels, respectively, regardless of the levels of the clock signals CK and CKB. As a result, a high-level first output signal $OUT_1$ is outputted to the first output terminal $OUT_1$ of the unit circuit 11, and a low-level second output signal $OUT_2$ is outputted to the second output terminal $OUT_2$.

On the other hand, when a high-level input signal IN is inputted to the input terminal IN and a high-level all-on control signal AON and a low-level all-on control signal AONB are respectively inputted to the all-on control terminals AON and AONB, the transistors $T_{21}$ and $T_7$ are brought into on-state. Such a mode as this is prohibited because through-current flows to the transistors $T_{21}$ and $T_7$. Note that a low-level second output signal $OUT_2$ from the previous stage is inputted to the input terminal IN unless the shift register 10 malfunctions. Accordingly, the high-level input signal IN is inputted when a high-level start pulse ST is externally inputted to the first-stage unit circuit 11.

Described next is a case of normal operation. During normal operation, as opposed to during all-on operation, a low-level all-on control signal AON is inputted to the all-on control terminal AON, and a high-level all-on control signal AONB is inputted to the all-on control terminal AONB. When the input signal IN is at high level, signals at the same level as the clock signal CK are outputted as the first output signal $OUT_1$ and the second output signal $OUT_2$. Note that when the input signal IN and the clock signals CK and CKB are all at high level, the transistors $T_5$, $T_6$, and $T_7$ are all brought into on-state, so that through-current flows to the transistors $T_5$, $T_6$, and $T_7$. Accordingly, any mode in which the input signal IN and the clock signals CK and CKB are all at high level is prohibited.

Also, when the input signal IN is at low level, if the clock signal CK is at low level, the first and second output signals $OUT_1$ and $OUT_2$ are set to low level regardless of the potentials of the nodes $N_1$ and $N_2$. When the input signal IN is at low level, if the potential of the node $N_2$ is set to VDD and the potential of the node $N_1$ is set to VSS, both the first output signal $OUT_1$ and the second output signal $OUT_2$ are set to low level. Conversely, if the potential of the node $N_2$ is set to VSS and the potential of the node $N_1$ is set to VDD, clock signals CK are outputted as the first output signal $OUT_1$ and the second output signal $OUT_2$. Note that when the input signal is at low level and both the clock signals CK and CKB are at high level, the first output signal $OUT_1$ and the second output signal $OUT_2$ are both at low level. This mode is employed to stop the clock signals.

Figure 4:
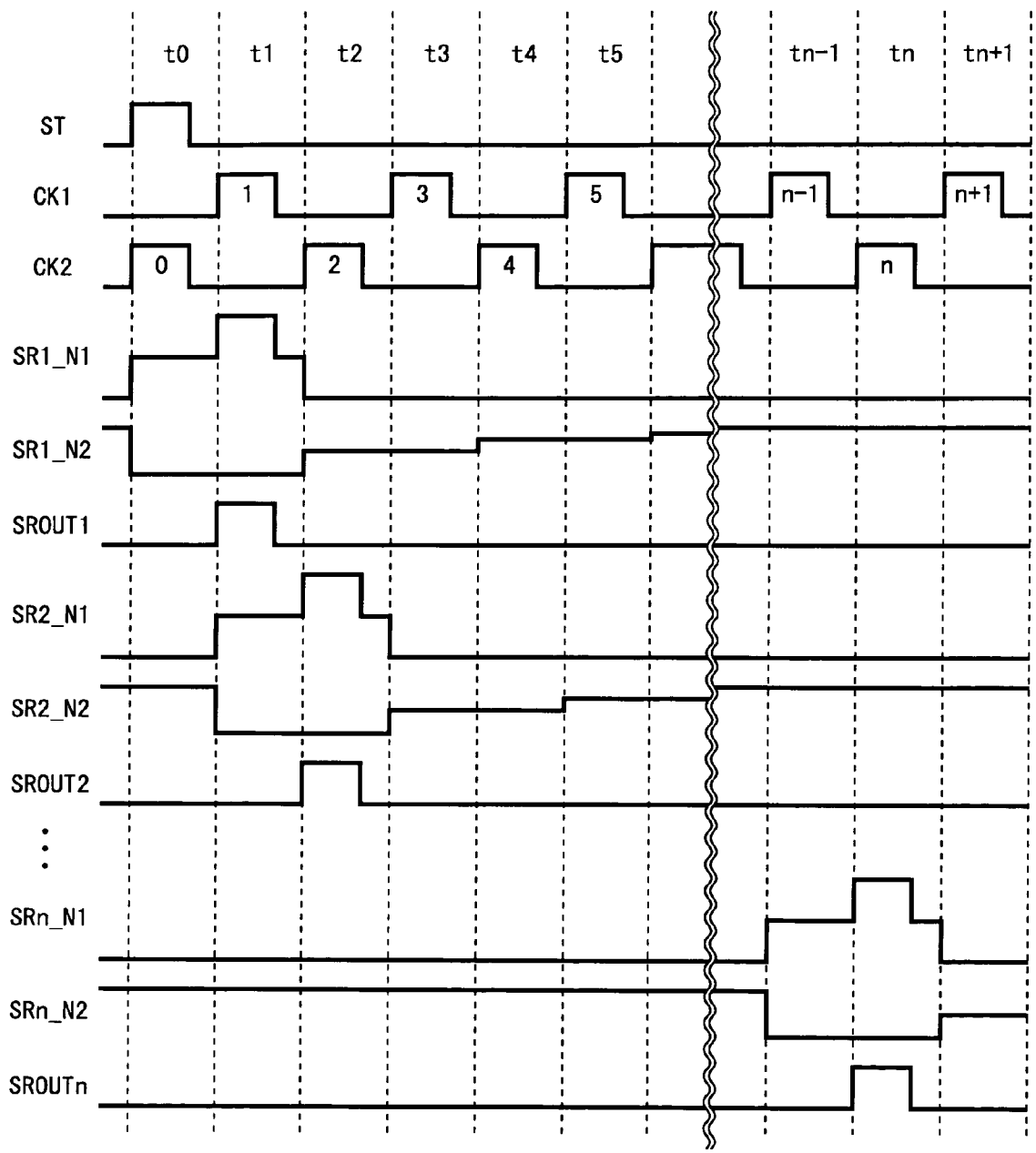
FIG. 4 is a timing chart for normal operation of the shift register shown in FIG. 1.

Normal operation will be described with reference to a timing chart. FIG. 4 is a timing chart for normal operation of the shift register 10 from period $t_0$ to period $t_{n+1}$. In FIG. 4, periods $t_0$ to $t_{n+1}$ are each divided into first and second sections, and during the normal operation period, the all-on control signal AON is set at low level, and the all-on control signal AONB is set at high level.

The start pulse ST is set to high level during the first section of period $t_0$, the clock signal $CK_1$ is set to high level during the first section of period $t_{od}$ (where od is an odd number; hereinafter, referred to as an odd-numbered period), and the clock signal $CK_2$ is set to high level during the first section of period $t_{ev}$ (where ev is an even number; hereinafter, referred to as an even-numbered period). During other periods, these three signals are set at low level. In this manner, the clock signals $CK_1$ and $CK_2$ behave such that their high-level periods do not overlap.

As shown in FIG. 4, when the start pulse ST is provided as the input signal IN, the first-stage unit circuit 11 (hereinafter, referred to as the unit circuit $SR_1$) operates as described below. In the unit circuit $SR_1$, the input signal IN is set to high level during the first section of period $t_0$, the clock signal CK is set to high level during the first sections of the odd-numbered periods, and the clock signal CKB is set to high level during the first sections of the even-numbered periods.

Before period $t_0$, the start pulse ST is set at low level, and therefore the transistors $T_1$ and $T_7$ are in off-state. At this time, the potentials of the nodes $N_2$ and $N_3$ are set at VDD (the reason for which will be described later), and therefore the transistors $T_3$ and $T_4$ are in on-state. Accordingly, the potentials of the node $N_1$ and the first output terminal $OUT_1$ are set at VSS, and therefore the transistor $T_2$ is in off-state. At this time, the capacitance $C_1$ has no charge accumulated therein, and the capacitances $C_2$ and $C_3$ have accumulated therein a charge corresponding to the power-supply voltage VDD.

During the first section of period $t_0$, the start pulse ST and the clock signal CKB are set to high level, and therefore the transistors $T_1$, $T_6$, and $T_7$ are brought into on-state. As a result, the charges accumulated in the capacitances $C_2$ and $C_3$ are released, so that the potentials of the nodes $N_2$ and $N_3$ are set to VSS, and the transistors $T_3$, $T_4$, and $T_{32}$ are brought into off-state. Also, when the transistor $T_1$ is brought into on-state, the potential of the node $N_1$ is set to $(VDD-V_{th})$ (where $V_{th}$ is a threshold voltage of the transistor $T_1$), and the transistors $T_2$ and $T_{31}$ are brought into on-state. At this time, the clock signal CK is set at low level, and therefore both the first output signal $OUT_1$ and the second output signal $OUT_2$ remain at low level. Accordingly, the capacitance $C_1$ has accumulated therein a charge corresponding to the difference $(VDD-V_{th})$ in potential between the gate and the source of the transistor $T_2$.

During the second section of period $t_0$, the start pulse ST and the clock signal CKB are set to low level, and therefore the transistors $T_1$, $T_6$, and $T_7$ are brought into off-state. When the transistor $T_1$ is brought into off-state, the node $N_1$ is brought into floating state, but the capacitance $C_1$ maintains the potential of the node $N_1$ at $(VDD-V_{th})$.

During the first section of period $t_1$, the clock signal CK is set to high level. At this time, the transistors $T_2$ and $T_{31}$ are in on-state, both the first output signal $OUT_1$ and the second output signal $OUT_2$ are set to high level. The node $N_1$ is in floating state, and the node $N_1$ and the source terminal of the transistor $T_2$ are connected via the capacitance $C_1$ maintaining the potential difference $(VDD-V_{th})$. When the potential at the source terminal of the transistor $T_2$ changes from VSS to VDD, the potential of the node $N_1$ changes by the same amount to be higher than the power-supply voltage VDD (bootstrap effect). As a result, the clock signal CK, the maximum voltage of which is VDD, passes through the transistor $T_2$ without voltage drop, and the first output terminal $OUT_1$ outputs the clock signal CK at the same voltage level. Also, the second output terminal $OUT_2$ outputs the potential $(VDD-V_{th})$ at the source terminal of the transistor $T_{31}$.

When the clock signal CK is set to high level, the transistor $T_5$ is brought into on-state. At this time, the transistor $T_6$ is in off-state, and therefore the potential of the node $N_3$ is set to VDD, so that the capacitance $C_2$ has accumulated therein a charge corresponding to the power-supply voltage VDD.

During the second section of period $t_1$, the clock signal CK is set to low level. At this time, the transistors $T_2$ and $T_{31}$ are in on-state, and therefore the first output signal $OUT_1$ and the second output signal $OUT_2$ are also set to low level, so that the potential of the node $N_1$ returns to $(VDD-V_{th})$. Also, the transistor $T_5$ is brought into off-state. At the end of period $t_1$, the potential of the node $N_2$ is set at VSS, and the potential of the node $N_3$ is set at VDD.

During the first section of period $t_2$, the clock signal CKB is set to high level, and therefore the transistor $T_6$ is brought into on-state. At this time, the charge accumulated in the capacitance $C_2$ partially moves to the capacitance $C_3$, so that the potential of the node $N_2$ rises. When the capacitances $C_2$ and $C_3$ are equal in capacitance value, the nodes $N_2$ and $N_3$ are equalized in potential, so that the potential of the node $N_2$ rises to VDD/2. When determining the capacitance values of the capacitances $C_2$ and $C_3$, they are determined such that the potential of the node $N_2$ at that time is higher than the threshold voltages of the transistors $T_3$ and $T_4$. Therefore, during the first section of period $t_2$, the transistors $T_3$, $T_4$, and $T_{32}$ are brought into on-state, and the potentials of the node $N_1$, the first output terminal $OUT_1$, and the second output terminal $OUT_2$ are set to VSS.

Subsequently, the reset signal generation circuit in the unit circuit $SR_1$ operates as described below. During the first sections of the odd-numbered periods, the clock signals CK and CKB are set to high and low levels, respectively, and therefore the transistors $T_5$ and $T_6$ are brought into on- and off-states, respectively. At this time, the potential of the node $N_3$ is set to VDD, so that the capacitance $C_2$ has accumulated therein a charge corresponding to the power-supply voltage VDD. On the other hand, during the first sections of the even-numbered periods, the clock signals CK and CKB are set to low and high levels, respectively, and therefore the transistors $T_5$ and $T_6$ are brought into off- and on-states, respectively. At this time, the charge accumulated in the capacitance $C_2$ partially moves to the capacitance $C_3$, so that the potential of the node $N_2$ rises. When the capacitances $C_2$ and $C_3$ are equal in capacitance value, the potential of the node $N_2$ gradually rises and ultimately reaches VDD.

As a result, as shown in FIG. 4, the potential (indicated as $SR_1\_N_1$; the same applies below) of the node $N_1$ in the unit circuit $SR_1$ is set to $(VDD-V_{th})$ during period $t_0$ and the second section of period $t_1$, to a level higher than VDD during the first section of period $t_1$, and to VSS during other periods. The potential of the node $N_2$ in the unit circuit $SR_1$ is set to VSS during periods $t_0$ and $t_1$, and it gradually rises during period $t_2$ and periods subsequent thereto and ultimately reaches VDD. The first output signal $OUT_1$ (the output signal $SROUT_1$ from the shift register 10) and the second output signal $OUT_2$ from the unit circuit $SR_1$ are set to high level during the first section of period $t_1$ and to low level during other periods.

Similarly, the first output signal $OUT_{1i}$ (the output signal $SROUT_i$ from the shift register 10) and the second output signal $OUT_{2i}$ from the i'th-stage (where i is an integer from 1 to n) unit circuit 11 are set to high level during the first section of period $t_i$ and to low level during other periods. In this manner, the shift register 10 sequentially sets the output signals $SROUT_1$ to $SROUT_n$ to high level one at a time based on the two-phase clock signals $CK_1$ and $CK_2$. Note that in the case of normal operation, as described above, the first output signal $SROUT_i$ and the second output signal $OUT_{2i}$ from the i'th-stage unit circuit 11 are signals to be outputted at the same level during the same period. Therefore, in FIG. 4, the first output signal $SROUT_{1i}$ and the second output signal $OUT_{2i}$ from the i'th-stage unit circuit 11 are collectively denoted by SROUTi.

Figure 5:
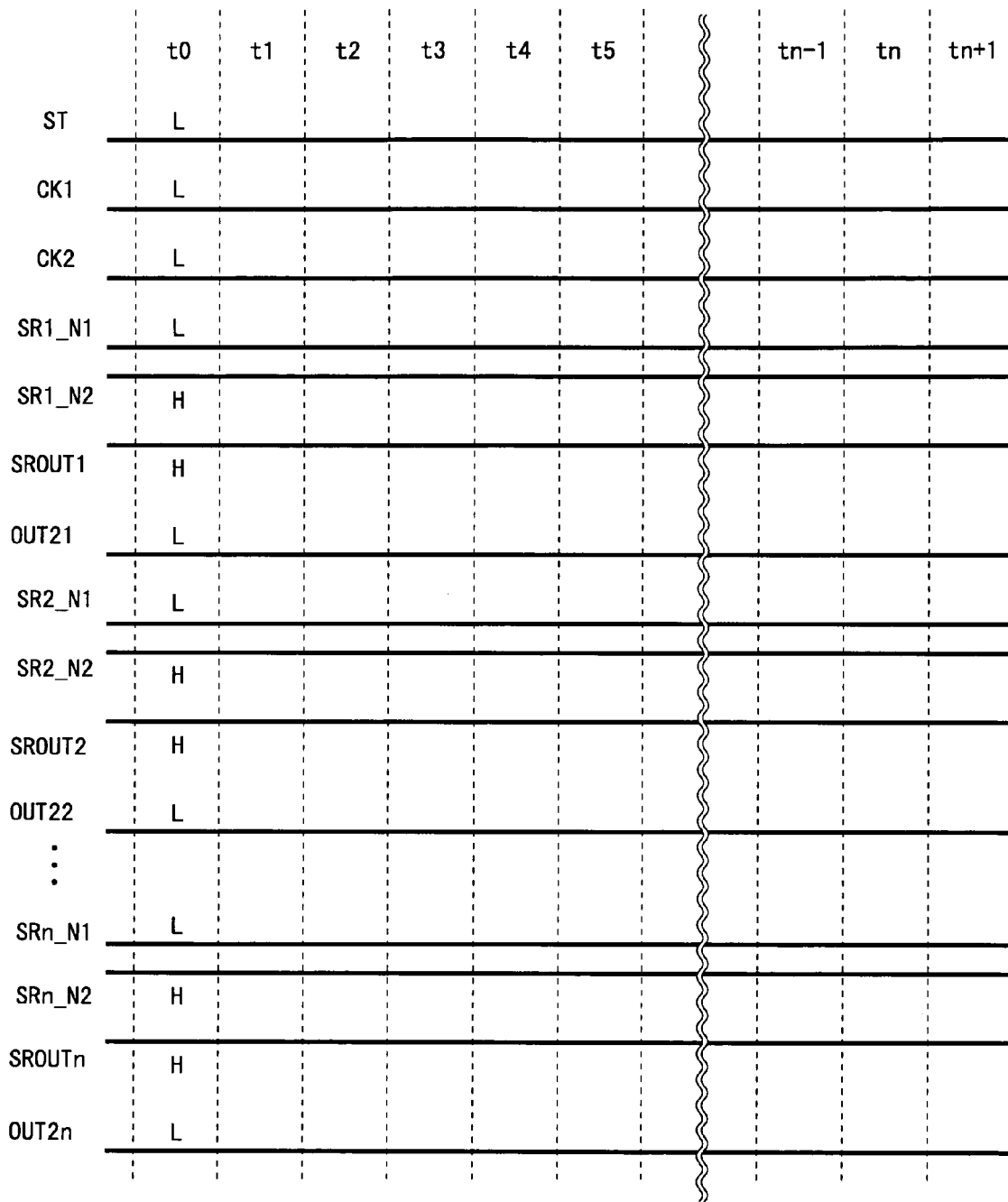
FIG. 5 is a timing chart for all-on operation of the shift register shown in FIG. 1.

Next, all-on operation will be described with reference to a timing chart. FIG. 5 is a timing chart for the shift register 10 during all-on operation. During the all-on operation period, the all-on control signal AON is set at high level, and the all-on control signal AONB is set at low level. In this case, the input signal IN inputted to the gate terminals of the transistors $T_1$ and $T_7$ is set at low level, and therefore the transistors $T_1$ and $T_7$ maintain off-state. Also, the all-on control signal AON brings the transistor $T_{21}$ into on-state, so that the potential of the node $N_2$ is set to $(VDD-V_{th})$.

Furthermore, the potential $(VDD-V_{th})$ of the node $N_2$ is provided to the gate terminal of the transistor $T_4$, bringing the transistor $T_4$ into on-state, so that the potential of the node $N_1$ is set to VSS. That is, regardless of the levels of the clock signals CK and CKB, the potential of the node $N_1$ is set to VSS, and the potential of the node $N_2$ is set to $(VDD-V_{th})$. Therefore, in FIG. 5, the levels of the clock signals CK and CKB are set to be low from period $t_0$ to period $t_{n+1}$.

When the potential of the node $N_2$ reaches $(VDD-V_{th})$, the transistor $T_{32}$ is brought into on-state. As a result, the second output terminal $OUT_2$ outputs the second output signal $OUT_2$ at a level of VSS. On the other hand, when the potential of the node $N_1$ reaches VSS, the transistors $T_2$ and $T_{31}$ are brought into off-state. At this time, the high-level all-on control signal AON is provided to the gate terminal of the transistor $T_{24}$, and therefore the transistor $T_{24}$ is brought into on-state. Accordingly, the first output terminal $OUT_1$ outputs the first output signal $OUT_1$ at a level of $(VDD-V_{th})$ (where $V_{th}$ is a threshold voltage of the transistor $T_{24}$).

Also, the low-level all-on control signal AONB is provided to the gate terminal of the transistor $T_{22}$, bringing the transistor $T_{22}$ into off-state. Accordingly, the potential $(VDD-V_{th})$ of the node $N_2$ is not provided to the gate terminal of the transistor $T_3$. On the other hand, the high-level all-on control signal AON is provided to the gate terminal of the transistor $T_{23}$, bringing the transistor $T_{23}$ into on-state. As a result, the potential VSS is provided to the gate terminal of the transistor $T_3$, bringing the transistor $T_3$ into off-state.

In this manner, during all-on operation, from period $t_0$ to period $t_{n+1}$, the first output terminal $OUT_1$ outputs the high-level, $(VDD-V_{th})$, first output signal $OUT_1$, while the second output terminal $OUT_2$ outputs the low-level, VSS, second output signal $OUT_2$.

That is, the first output terminal $OUT_1$ of the first-stage unit circuit $SR_1$ always outputs the high-level output signal $SROUT_1$, while the second output terminal $OUT_2$ always outputs the low-level output signal $OUT_{21}$. Also, the first output terminal $OUT_1$ of the second-stage unit circuit $SR_2$ always outputs the high-level output signal $SROUT_2$, while the second output terminal $OUT_2$ always outputs the low-level output signal $OUT_{22}$. Similarly, the first output terminal $OUT_1$ of the i'th-stage unit circuit $SR_i$ always outputs the high-level output signal $SROUT_i$, while the second output terminal $OUT_2$ always outputs the low-level output signal $OUT_{2i}$.

Described next is an effect of the shift register 10 according to the present embodiment. When the shift register 10 performs all-on operation, the transistor $T_3$ is in off-state, and therefore no through-current flows to the transistors $T_{24}$ and $T_3$. Also, even when the clock signal CK provided to the clock terminal CK is set to low level, the transistor $T_2$ remains in off-state, and therefore no through-current flows to the transistors $T_{24}$ and $T_2$. Thus, power consumption of the shift register 10 can be minimized.

The all-on control terminals AON and AONB are simply connected to the gate terminals of the transistors $T_{21}$ to $T_{24}$, and not connected to any external device via the first output terminal $OUT_1$. Accordingly, load on the all-on control signal lines can be reduced during all-on operation.

The first output signal $OUT_1$ from the unit circuit 11 to the exterior can be outputted independently of the second output signal $OUT_2$ to be inputted to the subsequent-stage unit circuit 11, and therefore the levels of the first output signal $OUT_1$ and the second output signal $OUT_2$ can be changed during all-on operation. Also, the shift register 10 can perform all-on operation without being affected by the clock signals CK and CKB.

Also, when the transistor $T_3$ is brought into on-state during normal operation, the same off-voltage is provided to the source and gate terminals of the transistor $T_2$. At this time, no potential difference occurs between the source and gate terminals of the transistor $T_2$ even when the value of the off-voltage varies due to the power circuit being affected by noise, and therefore the transistor $T_2$ is not brought into on-state. Thus, no through-current flows to the transistors $T_2$ and $T_3$.

Second to fourth embodiments will be described next, where shift registers are provided with unit circuits different from the unit circuit 11 of the shift register 10.

<2. Second Embodiment>

The shift register according to the second embodiment of the present invention is configured in the same manner as the shift register 10, and therefore its block diagram and description are omitted.

Figure 6:
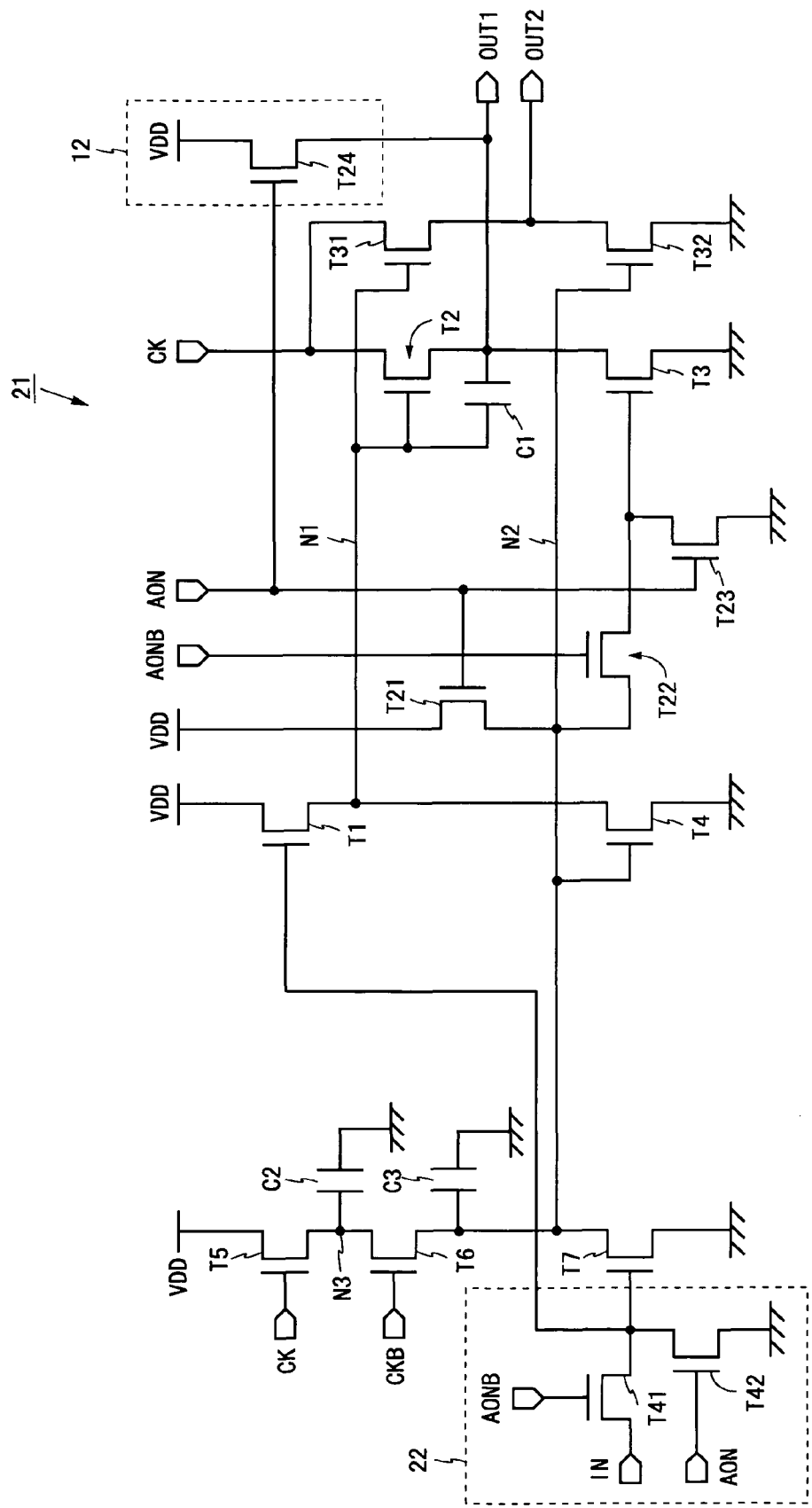
FIG. 6 is a circuit diagram of a unit circuit included in a shift register according to a second embodiment of the present invention.

FIG. 6 is a circuit diagram of a unit circuit 21 included in the shift register. Elements of the unit circuit 21 which correspond to those of the unit circuit 11 shown in FIG. 2 are denoted by the same reference characters and any descriptions thereof will be omitted. The unit circuit 21 has two input circuits, i.e., transistors $T_1$ and $T_7$, as provided in the unit circuit 11, and these transistors are connected at their gate terminals to an output terminal of an input signal control circuit 22.

The input signal control circuit 22 includes two N-channel transistors $T_{41}$ and $T_{42}$, and the transistor $T_{41}$ is connected at a drain terminal to an input terminal IN and at a gate terminal to an all-on control terminal AONB. Also, the transistor $T_{42}$ is connected at a gate terminal to an all-on control terminal AON and grounded at a source terminal. Both the source terminal of the transistor $T_{41}$ and the drain terminal of the transistor $T_{42}$, acting as output terminals of the input signal control circuit 22, are connected to the gate terminals of the transistors $T_1$ and $T_7$.

The operation of the input signal control circuit 22 will be described. During normal operation, the all-on control signals AON and AONB are set to low and high levels, respectively, bringing the transistors $T_{41}$ and $T_{42}$ into on- and off-states, respectively. Therefore, when the second output signal $OUT_2$ from the second output terminal $OUT_2$ of the previous-stage unit circuit 21 is inputted as an input signal IN to the input terminal IN connected to the drain terminal of the transistor $T_{41}$, the second output signal $OUT_2$ from the previous-stage unit circuit 21 is provided to the gate terminal of the transistor $T_7$. As a result, the transistors $T_1$ and $T_7$ are brought into on- or off-state in accordance with the level of the input signal IN provided to the input terminal IN.

On the other hand, during all-on operation, the all-on control signal AON is set to high level, and the all-on control signal AONB is set to low level. Accordingly, in the case of the input signal control circuit 22, contrary to during normal operation, the transistor $T_{41}$ is brought into off-state, and the transistor $T_{42}$ is brought into on-state. As a result, VSS is always provided to the gate terminals of the transistors $T_1$ and $T_7$, so that the transistors $T_1$ and $T_7$ maintain off-state regardless of the level of the input signal IN.

FIG. 7 is a truth table illustrating the operation of the shift register. As apparent from the above descriptions, during all-on operation, the transistors $T_1$ and $T_7$ maintain off-state regardless of the level of the input signal IN provided to the input terminal IN, and therefore the potentials of the nodes $N_1$ and $N_2$ are set to VSS and VDD, respectively. At this time, the transistor $T_{24}$ is brought into on-state, and therefore the first output terminal $OUT_1$ outputs the first output signal $OUT_1$ at a level of $(VDD-V_{th})$. Furthermore, the transistor $T_{32}$ is also brought into on-state, and therefore the second output terminal $OUT_2$ outputs the output signal $OUT_2$ at a level of VSS. In this manner, unlike in the unit circuit 11, no through-current flows to the transistors $T_{21}$ and $T_7$ even when the input signal IN is set at high level, and therefore it is not necessary to prohibit the mode in which the input signal IN is set at high level.

Note that the truth table for normal operation is the same as in FIG. 3, and therefore any description thereof will be omitted. Also, timing charts for the shift register during normal and all-on operations are also the same as in the first embodiment, and therefore any timing charts and descriptions thereof will be omitted.

The shift register according to the present embodiment has the input signal control circuit 22 connected to the gate terminals IN of the transistors $T_1$ and $T_7$, and therefore can perform all-on operation regardless of the level of the input signal IN.

<3. Third Embodiment>

The shift register according to the third embodiment of the present invention is configured in the same manner as the shift register 10, and therefore its block diagram and description will be omitted.

Figure 8:
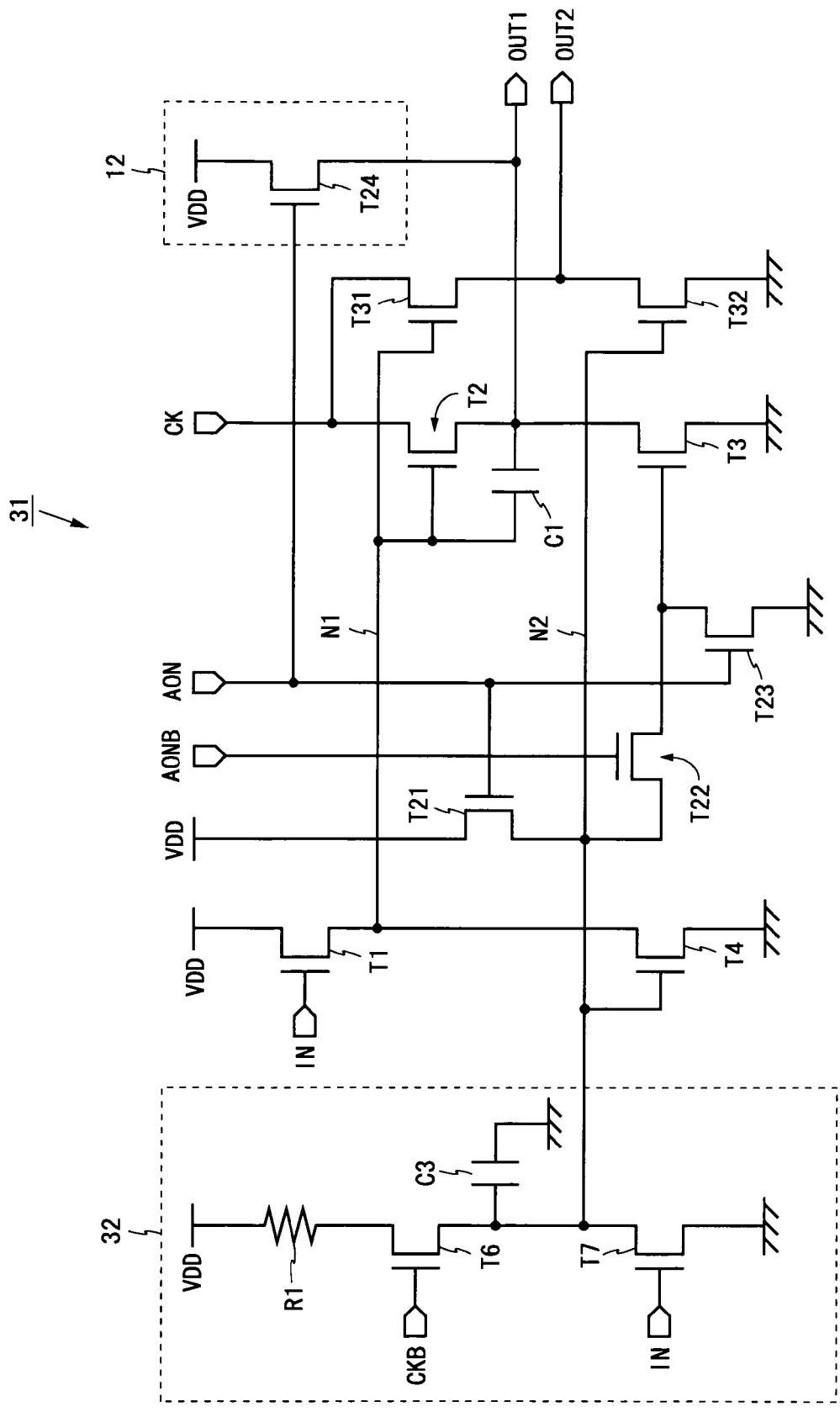
FIG. 8 is a circuit diagram of a unit circuit included in a shift register according to a third embodiment of the present invention.

FIG. 8 is a circuit diagram of a unit circuit 31 included in the shift register. Elements of the unit circuit 31 which correspond to those of the unit circuit 11 shown in FIG. 2 are denoted by the same reference characters, and any descriptions thereof will be omitted. The unit circuit 31 is provided with a reset signal generation circuit 32 partially different in configuration from the reset signal generation circuit provided in the unit circuit 11.

The reset signal generation circuit 32 differs from the reset generation circuit of FIG. 1, in that a resistive element $R_1$ is provided in place of the transistor $T_5$, and the capacitive element $C_2$ is omitted. Therefore, in the case of the reset signal generation circuit 32, when the clock signal CKB is set to high level, the transistor $T_6$ is brought into on-state, so that a charge corresponding to the power-supply voltage VDD is accumulated in the capacitance $C_3$. As a result, the potential of the node $N_2$ is set to $(VDD-V_{th})$.

Figure 9:
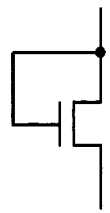
FIG. 9 is a circuit diagram illustrating another form of a resistive element included in the unit circuit shown in FIG. 8.

Specifically, in the reset signal generation circuit of FIG. 1, the levels of the clock signals CK and CKB are alternatingly changed to move a charge accumulated in the capacitance $C_2$ to the capacitance $C_3$, thereby gradually raising the potential of the node $N_2$ to VDD. On the other hand, in the reset signal generation circuit 32, when the high-level clock signal CKB is provided to the gate terminal of the transistor $T_6$, the transistor $T_6$ is brought into on-state, so that the potential of the node $N_2$ is rapidly raised to $(VDD-V_{th})$. Note that instead of using the resistive element $R_1$, a transistor as shown in FIG. 9 may be used where its drain and gate terminals are interconnected.

A truth table illustrating the operation of such a shift register and a timing chart for all-on operation are the same as in FIGS. 3 and 5, respectively, and therefore any illustrations and descriptions thereof will be omitted.

Figure 10:
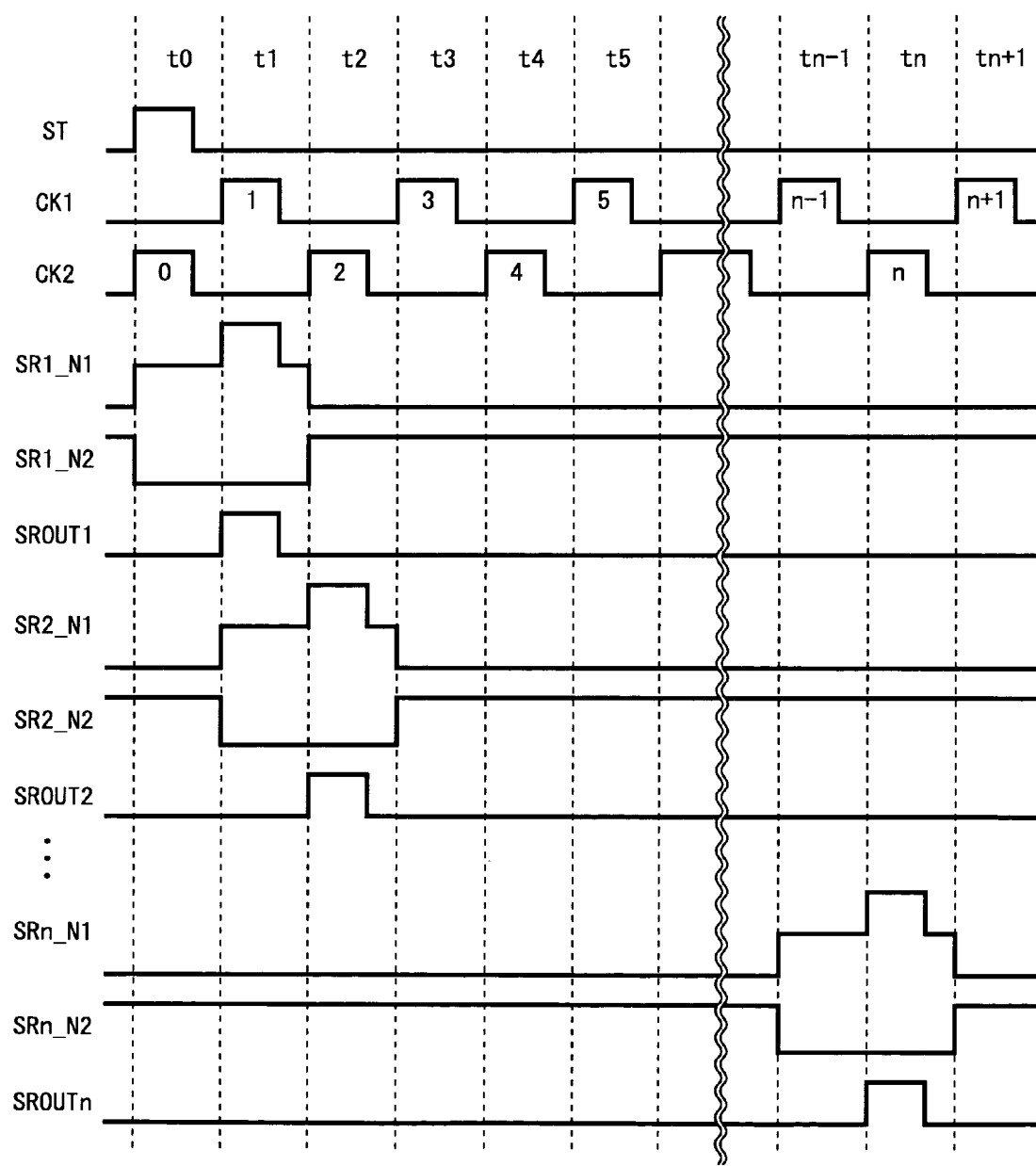
FIG. 10 is a timing chart for normal operation of a shift register having unit circuits as shown in FIG. 8 connected in multiple stages.

FIG. 10 is a timing chart for normal operation of a shift register having unit circuits 31 connected in multiple stages. Unlike in the timing chart of FIG. 4, the nodes $N_2$ of the unit circuits $SR_1$ and $SR_2$ have their respective potentials $SR_1\_N_2$ and $SR_2\_N_2$ steeply rising from VSS to $(VDD-V_{th})$ at the end of periods $t_1$ and $t_2$, respectively. Note that other parts of the timing chart are the same as in FIG. 4, and therefore any descriptions thereof will be omitted.

In the shift register according to the present embodiment, one of the transistors included in the reset signal generation circuit 32 of the unit circuit 31 is replaced by the resistive element $R_1$, allowing the potential of the node $N_2$ to steeply rise from VSS to $(VDD-V_{th})$.

<4. Fourth Embodiment>

The shift register according to the fourth embodiment of the present invention is configured in the same manner as the shift register 10, and therefore its block diagram and description are omitted.

Figure 11:
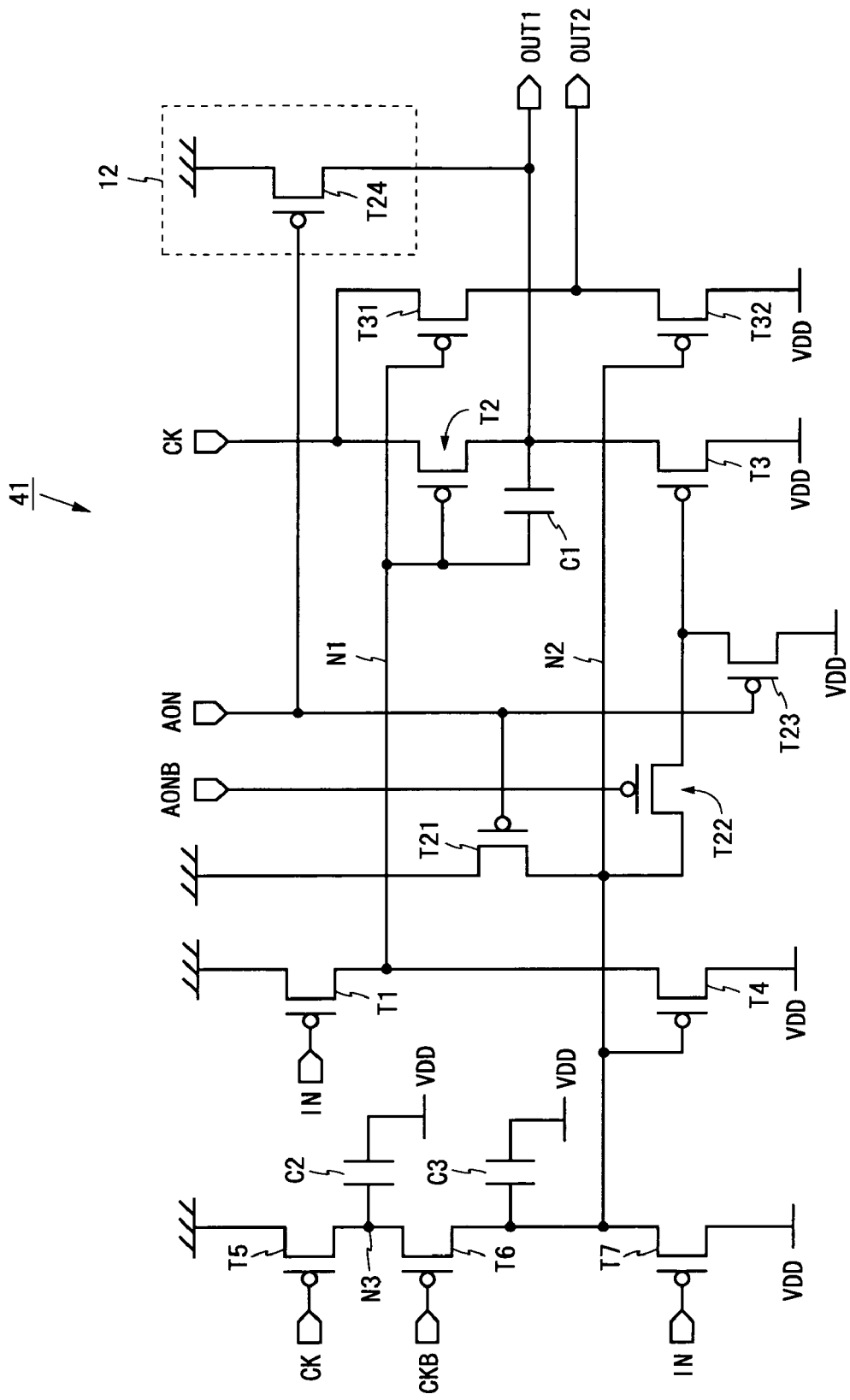
FIG. 11 is a circuit diagram of a unit circuit included in a shift register according to a fourth embodiment of the present invention.
Figure 12:
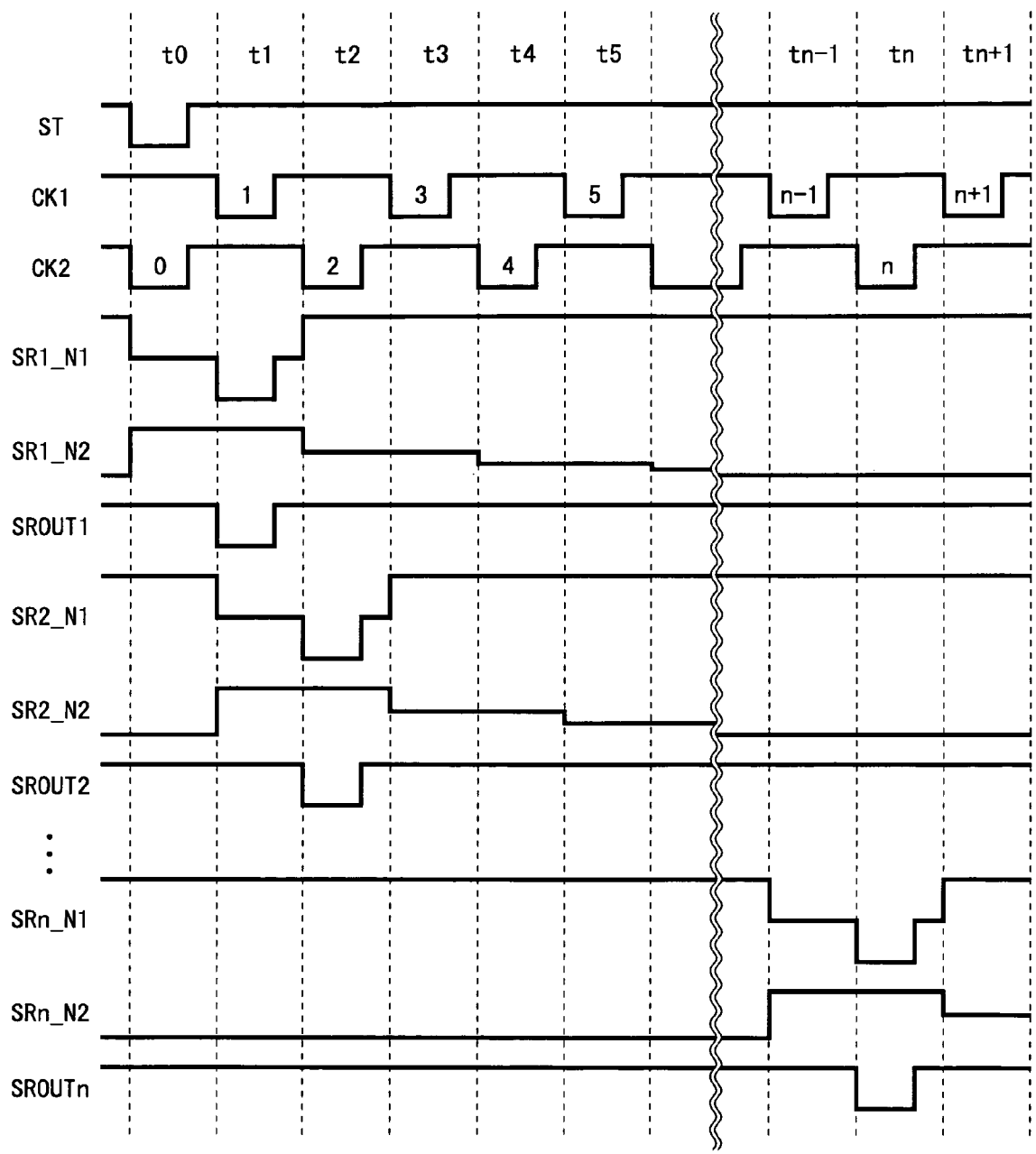
FIG. 12 is a timing chart for normal operation of a shift register having unit circuits as shown in FIG. 10 connected in multiple stages.

FIG. 11 is a circuit diagram of a unit circuit 41 included in the shift register. As shown in FIG. 11, the unit circuit 41 is configured by replacing all N-channel transistors included in the unit circuit 11 with P-channel transistors. Also, FIG. 12 is a timing chart for normal operation of the shift register having unit circuits 41 connected in multiple stages, and FIG. 13 is a timing chart for all-on operation of the shift register having unit circuits 41 connected in multiple stages. The details and operation of the unit circuit 41 are the same as those of the unit circuit 11, and therefore any descriptions thereof will be omitted. Also, the effect of the shift register according to the present embodiment is the same as that of the shift register 10 according to the first embodiment, and therefore any description thereof will be omitted.

This embodiment has been described regarding the unit circuit 41 having all N-channel transistors of only the unit circuit 11 replaced with P-channel transistors. However, the unit circuits 21 and 31 may also be unit circuits having all N-channel transistors replaced with P-channel transistors.

<5. Liquid Crystal Display Device Provided with the Shift Register>

Figure 14:
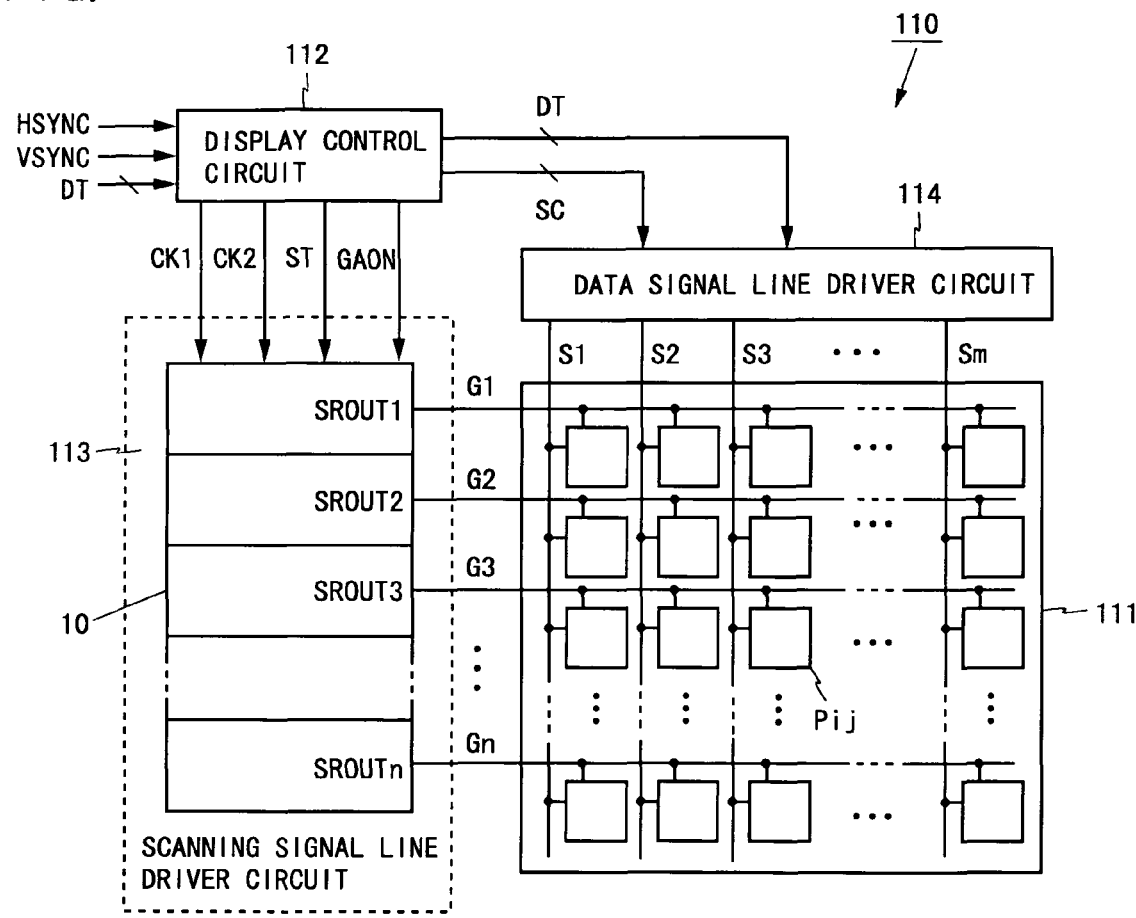
FIG. 14 is a block diagram illustrating the configuration of a liquid crystal display device provided with the shift register shown in FIG. 1.

Any of the shift registers described above can be used in a driver circuit of a display device or an imaging device, for example. FIG. 14 is a block diagram illustrating the configuration of a liquid crystal display device provided with a shift register 10. The liquid crystal display device 110 shown in FIG. 14 is an active-matrix display device provided with a display portion 111, a display control circuit 112, a scanning signal line driver circuit 113, and a data signal line driver circuit 114. In the liquid crystal display device 110, the shift register 10 is used as the scanning signal line driver circuit 113.

The display portion 111 shown in FIG. 14 includes n scanning signal lines $G_1$ to $G_n$, m data signal lines $S_1$ to $S_m$, and (m×n) display elements $P_{ij}$ (where m is an integer of 2 or more, and j is an integer from 1 to m). The scanning signal lines $G_1$ to $G_n$ are arranged parallel to one another, and the data signal lines $S_1$ to $S_m$ are arranged parallel to one another so as to be perpendicular to the scanning signal lines $G_1$ to $G_n$. The display element $P_{ij}$ is disposed in the vicinity of the intersection of the scanning signal line $G_i$ and the data signal line $S_j$. In this manner, the (m×n) display elements $P_{ij}$ are arranged two-dimensionally with each row including m of them and each column including n of them. The scanning signal line $G_i$ is connected commonly to the display elements $P_{ij}$ arranged in the i'th row, and the data signal line $S_j$ is connected commonly to the display element $P_{ij}$ arranged in the j'th column.

From the outside of the liquid crystal display device 110 are supplied control signals, such as a horizontal synchronization signal HSYNC and a vertical synchronization signal VSYNC, and display data DT. Based on these signals, the display control circuit 112 outputs clock signals $CK_1$ and $CK_2$, a start pulse ST, and all-on control signals GAON and GAONB to the scanning signal line driver circuit 113, and also outputs a control signal SC and the display data DT to the data signal line driver circuit 114.

The scanning signal line driver circuit 113 is configured by an n-stage shift register 10. When a low-level all-on control signal GAON and a high-level all-on control signal GAONB are provided to the shift register 10, the shift register 10 performs normal operation. Specifically, based on the clock signals $CK_1$ and $CK_2$, the shift register 10 outputs output signals $SROUT_1$ to $SROUT_n$, which are sequentially set to high level, to the scanning signal lines $G_1$ to $G_n$, respectively. As a result, the scanning signal lines $G_1$ to $G_n$ are sequentially selected one at a time, so that display elements $P_{ij}$ for one row are collectively selected.

Based on the control signal SC and the display data DT, the data signal line driver circuit 114 provides to each of the data signal lines $S_1$ to $S_m$ a voltage corresponding to the display data DT. As a result, the voltage corresponding to the display data DT is written to the selected display elements $P_{ij}$ for one row. In this manner, the liquid crystal display device 110 displays video.

On the other hand, when a high-level all-on control signal GAON and a low-level all-on control signal GAONB are provided to the scanning signal line driver circuit 113, the shift register 10 performs all-on operation. Therefore, the scanning signal line driver circuit 113 simultaneously provides high-level output signals $SROUT_1$ to $SROUT_n$ to the scanning signal lines $G_1$ to $G_n$, respectively, so that a voltage corresponding to the display data DT is written to all display elements $P_{ij}$.

Figure 15:
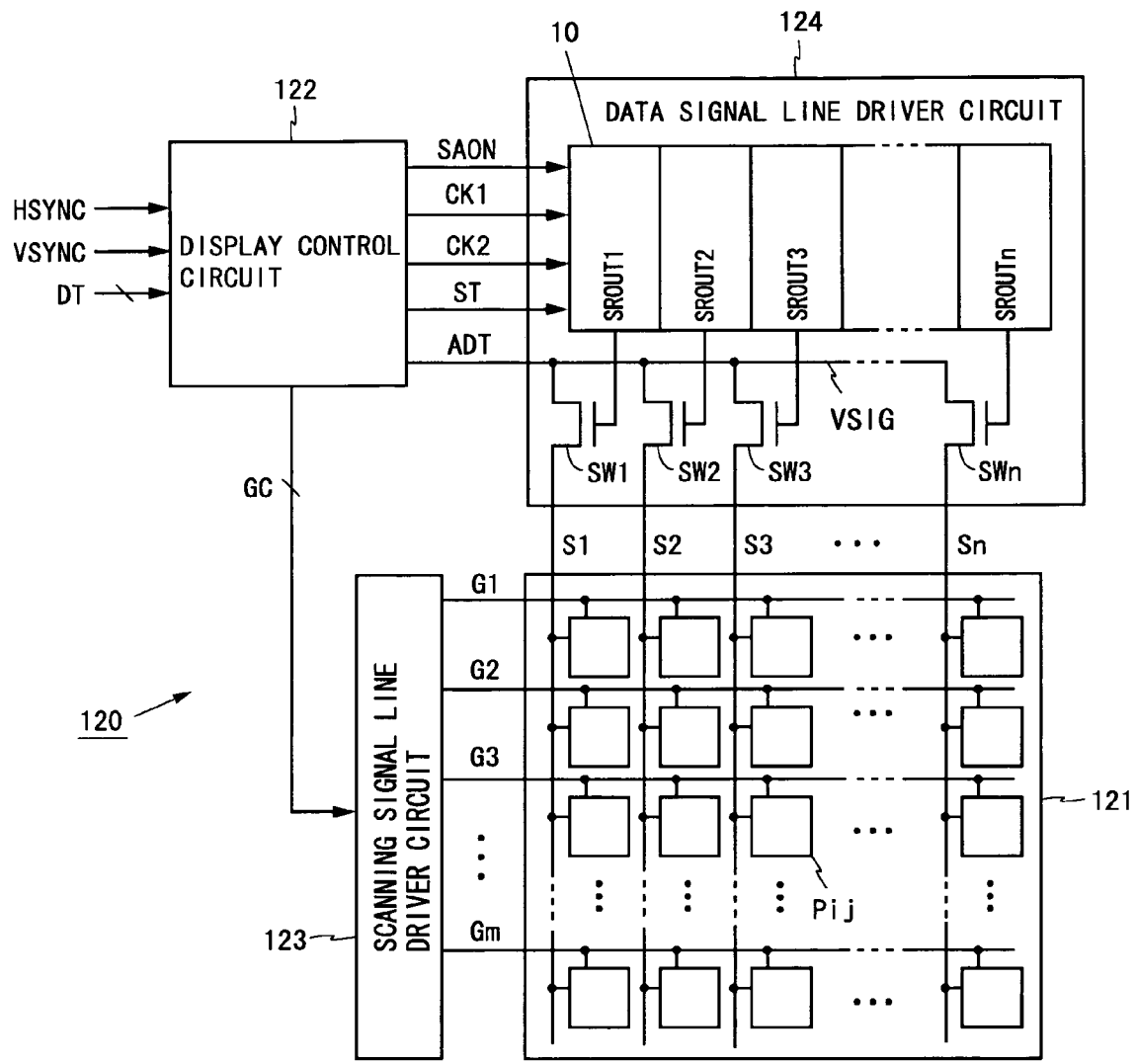
FIG. 15 is a block diagram illustrating the configuration of another liquid crystal display device provided with the shift register shown in FIG. 1.

FIG. 15 is a block diagram illustrating the configuration of another liquid crystal display device 120 provided with a shift register 10. The liquid crystal display device 120 shown in FIG. 15 is an active-matrix display device provided with a display portion 121, a display control circuit 122, a scanning signal line driver circuit 123, and a data signal line driver circuit 124. In the liquid crystal display device 120, the shift register 10 is included and used in the data signal line driver circuit 124 which performs dot-sequential drive.

The display portion 121 shown in FIG. 15 is configured in the same manner as the display portion 111 shown in FIG. 14. However, in the display portion 121, the number of scanning signal lines is m, the number of data signal lines is n, and (m×n) display elements $P_{ij}$ are provided two-dimensionally with each row including n of them and each column including m of them.

Based on control signals and display data DT, which are externally supplied, the display control circuit 122 outputs a control signal GC to the scanning signal line driver circuit 123, and also outputs clock signals $CK_1$ and $CK_2$, a start pulse ST, analog video data ADT, and all-on control signals SAON and SAONB to the data signal line driver circuit 124. Based on the control signal GC, the scanning signal line driver circuit 123 sequentially selects the scanning signal lines $G_1$ to $G_m$ one at a time.

The data signal line driver circuit 124 includes an n-stage shift register 10 and n sampling switches $SW_1$ to $SW_n$, which are formed by N-channel transistors. The sampling switches $SW_1$ to $SW_n$ are connected at one terminal to their respective data signal lines $S_1$ to $S_n$ and at the other terminal to a video signal line VSIG for transmitting the analog video data ADT. The N-channel transistors, which are the sampling switches $SW_1$ to $SW_n$, are provided at their gate terminals with output signals $SROUT_1$ to $SROUT_n$, respectively, from the shift register 10.

When a low-level all-on control signal SAON and a high-level all-on control signal SAONB are provided to the data signal line driver circuit 124, the shift register 10 performs normal operation. In this case, the output signals $SROUT_1$ to $SROUT_n$ are sequentially set to high level one at a time, so that the sampling switches $SW_1$ to $SW_n$ are sequentially turned on one at a time, and the analog video data ADT is provided to data signal lines connected to the sampling switches that have been turned on. As a result, for display elements $P_{ij}$ for one row selected by the scanning signal line driver circuit 123, a voltage corresponding to the analog video data ADT is sequentially written to one element at a time. In this manner, the liquid crystal display device 120 displays video.

On the other hand, when a high-level all-on control signal SAON and a low-level all-on control signal SAONB are provided to the data signal line driver circuit 124, the shift register 10 performs all-on operation. In this case, the shift register 10 simultaneously provides high-level output signals $SROUT_1$ to $SROUT_n$ to their respective gate terminals of the sampling switches $SW_1$ to $SW_n$. As a result, the sampling switches $SW_1$ to $SW_n$ are simultaneously turned on, so that the analog video data ADT is simultaneously provided to all the data signal lines $S_1$ to $S_n$. Accordingly, a voltage corresponding to the analog video data ADT is simultaneously written to the display elements $P_{ij}$ for one row selected by the scanning signal line driver circuit 123.

Figure 16:
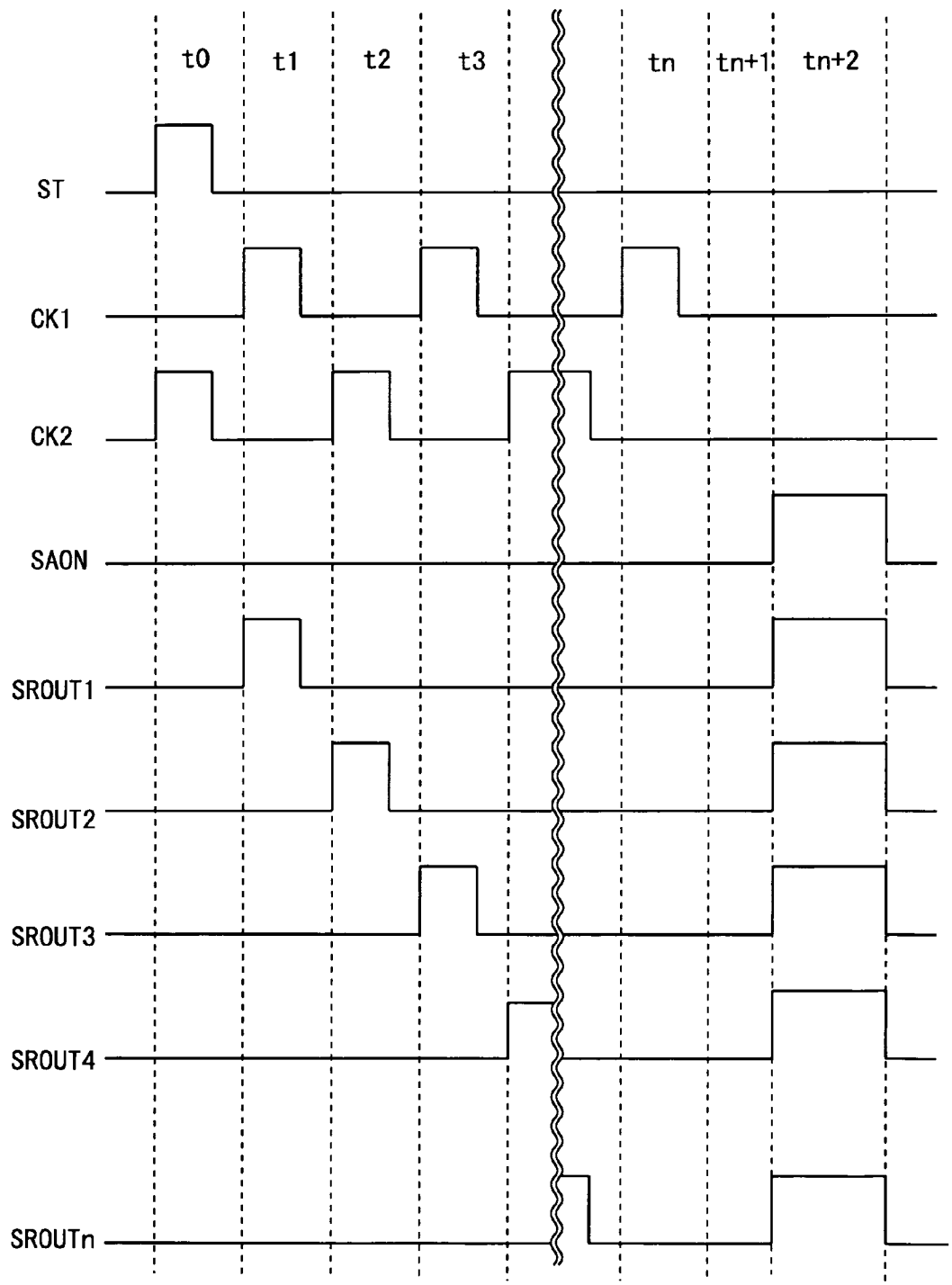
FIG. 16 is a timing chart for the liquid crystal display device shown in FIG. 15.

FIG. 16 is a timing chart for the liquid crystal display device 120. As shown in FIG. 16, the shift register 10 included in the data signal line driver circuit 124 performs normal operation from period $t_0$ to period $t_n$. In this case, high-level output signals $SROUT_1$ to $SROUT_n$ are sequentially outputted one at a time to the data signal lines $S_1$ to $S_n$, respectively. During period $t_{(n+2)}$, the all-on control signal SAON is set to high level, so that the shift register 10 performs all-on operation. At this time, the high-level output signals $SROUT_1$ to $SROUT_n$ are simultaneously outputted to the data signal lines $S_1$ to $S_n$, respectively.

As for liquid crystal display devices provided with a scanning signal line driver circuit or a data signal line driver circuit including the shift register 10, in each of the cases where the power circuit is turned on, turned off, or forcibly shut off, video might be disturbed. However, by causing the shift register included in the scanning signal line driver circuit or the data signal line driver circuit to perform all-on operation, it is rendered possible to suppress video disturbance to such a degree as to be unrecognizable to the human eye. Hereinafter, a description will be given for each of the above cases.

<6. Operation of the Liquid Crystal Display Device with the Power Circuit On>

Figure 17:
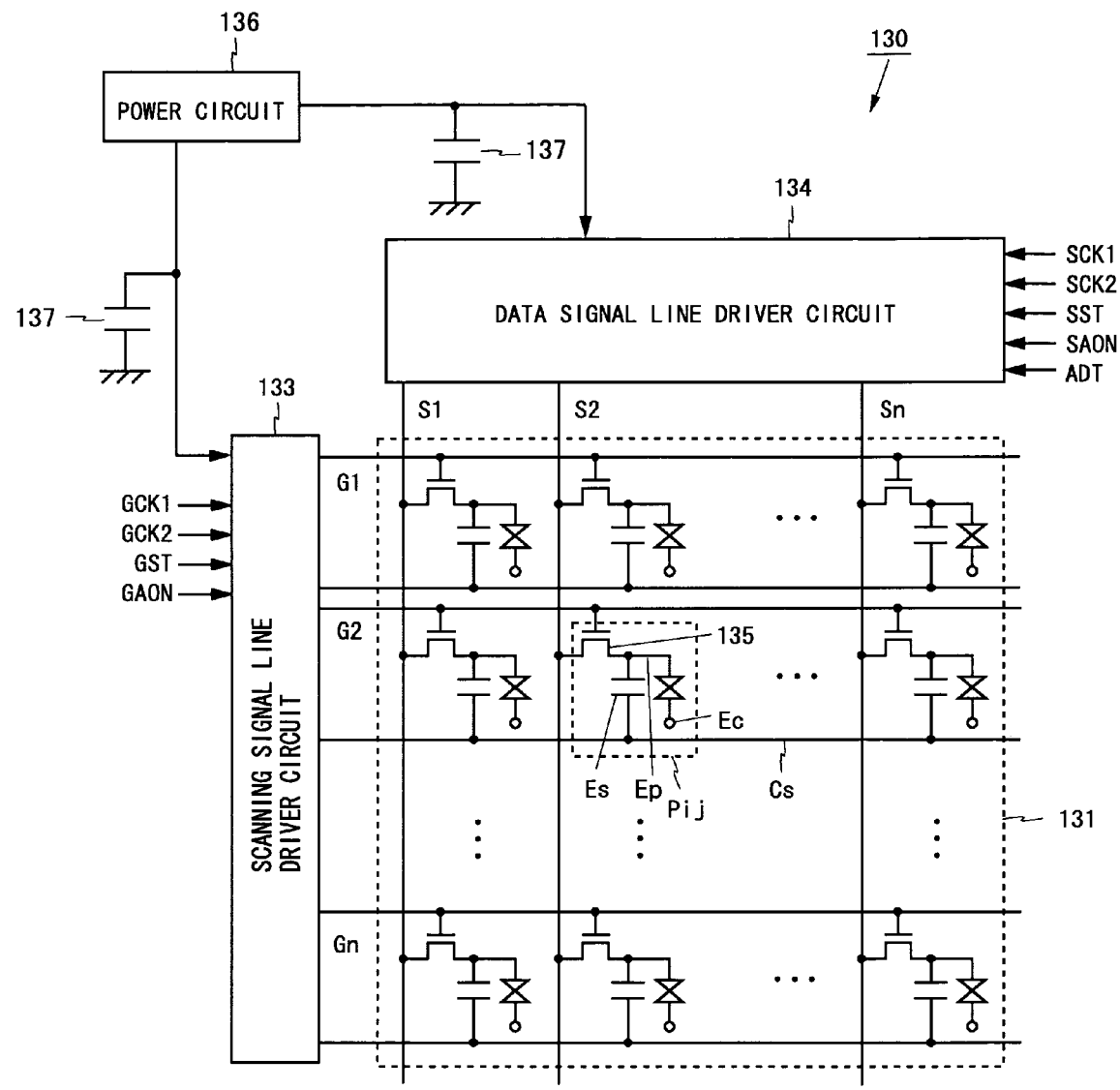
FIG. 17 is a block diagram illustrating the configuration of yet another liquid crystal display device provided with the shift register shown in FIG. 1.

FIG. 17 is a block diagram illustrating the configuration of yet another liquid crystal display device 130. The liquid crystal display device 130 shown in FIG. 17 is an active-matrix display device provided with a display portion 131, a scanning signal line driver circuit 133, and a data signal line driver circuit 134. The scanning signal line driver circuit 133 and the data signal line driver circuit 134 each include a shift register 10, and the liquid crystal display device 130 is driven by dot-sequential drive. Also, the scanning signal line driver circuit 133 and the data signal line driver circuit 134 are connected to a power circuit 136 which supplies power-supply voltages VH and VL, and capacitative elements 137 are provided between terminals of the power circuit 136 and ground terminals.

The display portion 131 includes n scanning signal lines $G_1$ to $G_n$, n data signal lines $S_1$ to $S_n$, and (n×n) display elements $P_{ij}$. The scanning signal lines $G_1$ to $G_n$ are arranged parallel to one another, and the data signal lines $S_1$ to $S_n$ are arranged parallel to one another so as to be perpendicular to the scanning signal lines $G_1$ to $G_n$. The display element $P_{ij}$ is disposed in the vicinity of the intersection of the scanning signal line $G_i$ and the data signal line $S_j$. In this manner, the (n×n) display elements $P_{ij}$ are arranged two-dimensionally with each row and column including n of them. The scanning signal line $G_i$ is connected commonly to display elements $P_{ij}$ arranged in the i'th row, and the data signal line $S_j$ is connected commonly to display elements $P_{ij}$ arranged in the j'th column.

The display elements $P_{ij}$ are each provided with a TFT 135 as a switching element. The TFTs 135 are connected at their gate electrodes to their respective scanning signal lines $G_1$ to $G_n$ and at their drain electrodes to their respective pixel electrodes Ep. A common electrode Ec is provided opposing the pixel electrodes Ep, so that liquid crystal capacitances are formed by the pixel electrodes Ep and the common electrode Ec. Furthermore, subsidiary electrodes Es are also provided on a substrate having the pixel electrodes Ep provided thereon, so that subsidiary capacitances are formed by the pixel electrodes Ep and the subsidiary electrodes Es. The subsidiary electrodes Es are connected to their respective subsidiary electrode drive signal lines Cs, and the subsidiary electrode drive signal lines Cs are connected to the scanning signal line driver circuit 133 or an external circuit.

The scanning signal line driver circuit 133 and the data signal line driver circuit 134 are each configured by an n-stage shift register 10. Clock signals $GCK_1$ and $GCK_2$, a start pulse GST, and an all-on control signal GAON are provided to the scanning signal line driver circuit 133, and clock signals $SCK_1$ and $SCK_2$, a start pulse SST, and an all-on control signal SAON are provided to the data signal line driver circuit 134. The scanning signal line driver circuit 133 and the data signal line driver circuit 134 respectively operate in the same manner as the scanning signal line driver circuit 113 of the liquid crystal display device 110 and the data signal line driver circuit 124 of the liquid crystal display device 120, and therefore any descriptions thereof will be omitted.

When the power circuit 136 of the liquid crystal display device 130 thus configured is turned on, video displayed on the display portion 131 might be disturbed immediately after the turn-on. This is conceivably due to the following reasons. The power-supply voltages VH and VL do not rise to a sufficient level immediately after the power circuit 136 is turned on. As a result, logic control of the liquid crystal display device 130 is not performed properly, so that an unnecessary charge flows from the video signal line VSIG into the display element $P_{ij}$, or the potential COM of the opposing electrode Ec or the potential of the subsidiary electrode Es is destabilized, so that a charge is accumulated between the opposing electrode Ec and the pixel electrode Ep, resulting in the above problem.

Therefore, if it is possible to instantaneously release an accumulated charge, video disturbance can be advantageously rendered unrecognizable to the human eye. Specifically, when the power circuit 136 is turned on, the TFTs 135 of all the display elements $P_{ij}$ are brought into on-state, thereby instantaneously releasing the accumulated charge. As a result, when the power-supply voltages VH and VL rise to a sufficient level, high-level (active) all-on control signals GAON and SAON are respectively provided to the scanning signal line driver circuit 133 and the data signal line driver circuit 134, thereby causing the scanning signal line driver circuit 133 and the data signal line driver circuit 134 to perform all-on operation.

Figure 18:
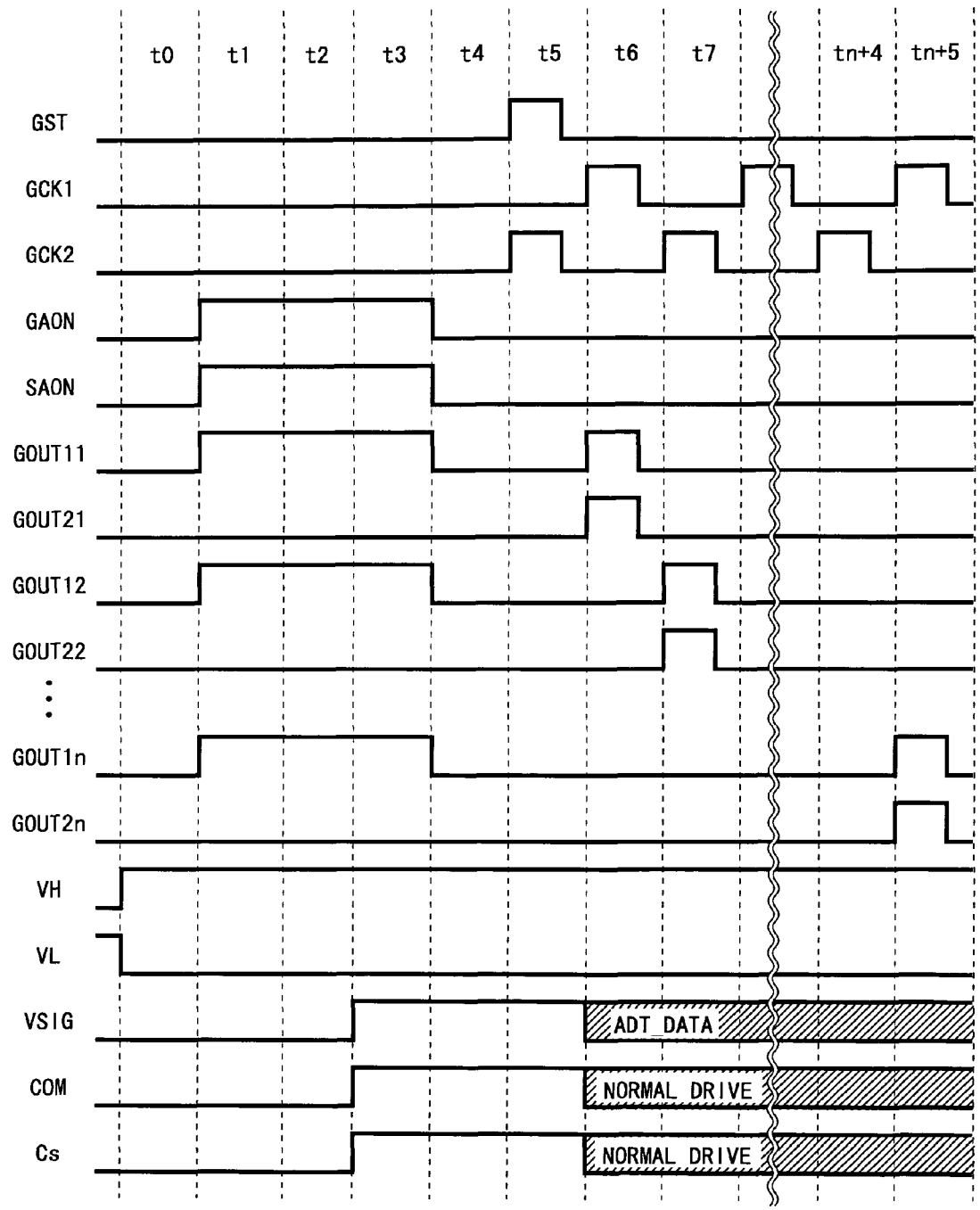

FIG. 18 is a timing chart illustrating the operation of the liquid crystal display device 130. As shown in FIG. 18, when the power circuit 136 is turned on at the start point of period $t_0$, the power-supply voltages VH and VL rise to a sufficient level within period $t_0$. Then, the all-on control signals GAON and SAON are set to high level at the start point of period $t_1$. At this time, the scanning signal line driver circuit 133 starts all-on operation, thereby providing high-level output signals $GOUT_{11}$ (first output signal from the first-stage unit circuit SR1) to $GOUT_{1n}$ (first output signal from the n'th-stage unit circuit $SR_n$) to the scanning signal lines $G_1$ to $G_n$, respectively. At this time, the data signal line driver circuit 134 also performs all-on operation, thereby simultaneously providing high-level output signals to the sampling switches $SW_1$ to $SW_n$.

As a result, the high-level output signals $GOUT_{11}$ to $GOUT_{1n}$ are provided to all the scanning signal lines $G_1$ to $G_n$, respectively, and therefore all the TFTs 135 are brought into on-state. Also, all the sampling switches $SW_1$ to $SW_n$ are turned on as well, so that the data signal lines $S_1$ to $S_n$ are connected to the video signal line VSIG. Also, at the beginning of period $t_1$, the potential of the video signal line VSIG, the potential COM of the opposing electrode Ec, and the potential of the subsidiary electrode Es are each set to low level, thereby releasing the charge accumulated in the display element $P_{ij}$ to the video signal line VSIG.

Then, at the start point of period $t_3$, the potential of the video signal line VSIG, the potential COM of the opposing electrode Ec, and the potential of the subsidiary electrode Es are set to their respective initial potential levels, thereby applying a charge of an initial value to the display element $P_{ij}$ through the video signal line VSIG. The reason for applying the charge of an initial value is because changing the potential COM of the opposing electrode Ec and the potential of the subsidiary electrode Es while the pixel electrode Ep is in floating state might result in video disturbance. After setting the all-on control signals GAON and SAON to low level at the end point of period $t_3$, the scanning signal line driver circuit 133 and the data signal line driver circuit 134 start normal operation at the start point of period $t_5$, thereby allowing the analog video data ADT to be transmitted to the video signal line VSIG from the start point of period $t_6$.

Note that while in the foregoing description of the operation timing, the power circuit 136 is turned on at the start point of period $t_0$, and the all-on operation is started at the start point of period $t_1$, the all-on operation may be started at the start point of period $t_0$ simultaneously with the turn-on of the power circuit 136. Also, while FIG. 18 illustrates a case where the opposing electrode Ec and the subsidiary electrode Es are subjected to alternating-current drive during normal operation, they may be subjected to direct-current drive.

Furthermore, if the shift register 10 is caused to perform all-on operation when the power circuit 136 is turned on, the potential of the node $N_2$ is set to (VDD−Vth), and therefore the transistor $T_{32}$ is brought into on-state. On the other hand, the potential of the node $N_1$ is set to low level, and therefore the transistors $T_2$ and $T_{31}$ are brought into off-state. Moreover, the high-level all-on control signal AON is provided to the gate terminal of the transistor $T_{23}$, so that the transistor $T_{23}$ is brought into on-state. Therefore, the transistor $T_3$ is brought into off-state.

Subsequently, when returning from all-on operation to normal operation, the all-on control signal AON is set to low level, and therefore the transistors $T_{21}$ and $T_{23}$ are brought into off-state. On the other hand, the all-on control signal AONB is set to high level, and therefore the transistor $T_{22}$ is brought into on-state. As a result, the transistor $T_3$ is brought into on-state, so that a low-level first output signal $OUT_1$ is outputted to the first output terminal $OUT_1$. Accordingly, when returning from all-on operation to normal operation, it is not necessary to initialize the shift register 10. As a result, the shift register 10 can return to normal operation more quickly because the initialization operation is not required. Also, since no initialization circuit is required to be provided in the unit circuit 11 of the shift register 10, the area for laying out the shift register 10 can be reduced. Note that the output signals $GOUT_{21}$ (second output signal from the first-stage unit circuit $SR_1$) to $GOUT_{2n}$ (second output signal from the n'th-stage unit circuit $SR_n$) in FIG. 18 are set to high level when their corresponding output signals $GOUT_{11}$ to $GOUT_{1n}$ are individually set to high level, and also set to low level when their corresponding output signals are individually set to low level. However, the output signals $GOUT_{21}$ to $GOUT_{2n}$ remain at low level even when all the output signals $GOUT_{11}$ to $GOUT_{1n}$ are set to high level by all-on operation.

<7. Operation of the Liquid Crystal Display Device with the Power Circuit Off>

Described next is a method for suppressing video disturbance based on an external instruction or an internally generated instruction when the power circuit 136 of the liquid crystal display device 130 is turned off.

Figure 19:
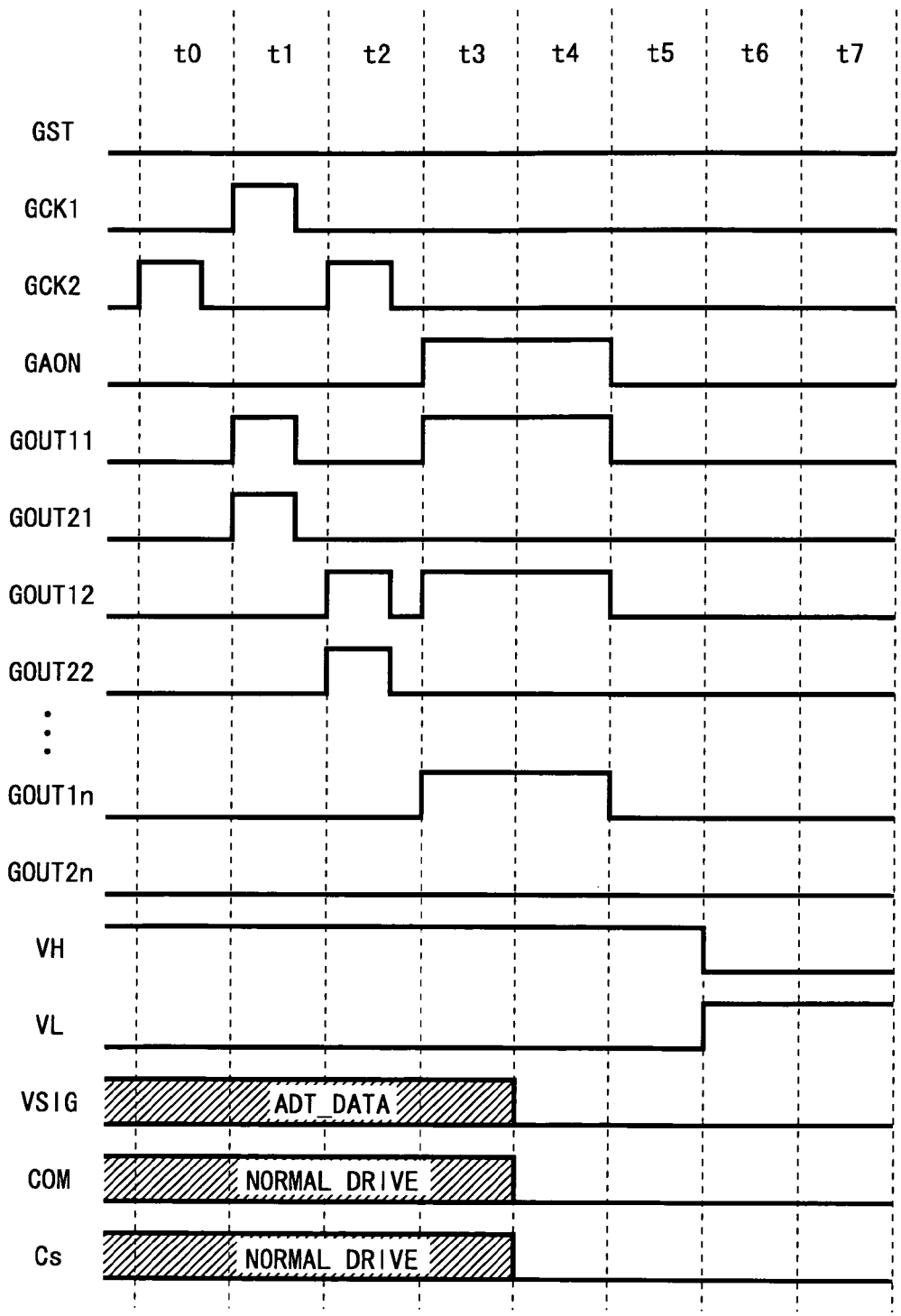
FIG. 19 is a timing chart for the liquid crystal display device shown in FIG. 16 where the power is off.

FIG. 19 is a timing chart where the power circuit 136 of the liquid crystal display device 130 is turned off. As shown in FIG. 19, the all-on control signal GAON is set at low level (inactive) from period $t_0$ to period $t_2$, and therefore the scanning signal line driver circuit 133 performs normal operation, thereby sequentially providing high-level scanning signals $GOUT_{11}$ to $GOUT_{12}$ to their respective scanning signal lines $G_1$ to $G_2$ one at a time. Similarly, the data signal line driver circuit 134 also sequentially provides high-level output signals to the sampling switches $SW_1$ to $SW_n$ one at a time, thereby sequentially turning the sampling switches $SW_1$ to $SW_n$ on.

When an instruction is given at the start point of period $t_3$ to turn off the power circuit 136 of the liquid crystal display device 130, a high-level (active) all-on control signal GAON is provided to the scanning signal line driver circuit 133. As a result, the scanning signal line driver circuit 133 starts all-on operation, thereby simultaneously providing high-level output signals $GOUT_{11}$ to $GOUT_{1n}$ to the scanning signal lines $G_1$ to $G_n$, respectively. Also, since the sampling switches $SW_1$ to $SW_n$ are all off, display elements $P_{ij}$ connected to the same data signal line are rendered conductive to one another. As a result, so long as the liquid crystal display device 130 is being subjected to dot-inversion drive or scanning signal line-inversion drive, positive and negative charges accumulated in adjacent or neighboring display elements $P_{ij}$ connected to the same data signal line cancel out each other. Then, when the potential COM of the opposing electrode Ec transitions to no-voltage state, the display status becomes approximately equal among all display elements $P_{ij}$. Furthermore, at the end point of period $t_3$, the potential of the video signal line VSIG, the potential COM of the opposing electrode Ec, and the potential of the subsidiary electrode Es are set to low level, thereby releasing charges accumulated in the display elements $P_{ij}$ toward the video signal line VSIG. Thereafter, all-on operation is terminated at the end point of period $t_4$, and furthermore the power circuit 136 is brought into off-state at the end point of period $t_5$. In this manner, it is possible to inhibit video displayed on display portion 131 from being disturbed when the power circuit 136 is brought into off-state. Note that this operation is applicable to liquid crystal display devices conforming with either dot-inversion drive or scanning signal line inversion drive.

Also, at the start point of period $t_3$, not only the scanning signal lines $G_1$ to $G_n$ are simultaneously set at high level, but also the all-on control signal SAON may be set to high level, thereby simultaneously setting the data signal lines $S_1$ to $S_n$ to high level as well. In this case, discharging can be performed such that all display elements $P_{ij}$ on the display portion 131 are rendered equal in charge state, and therefore video displayed on the display portion 131 can be inhibited from being disturbed when the power circuit 136 of the liquid crystal display device 130 is turned off. Note that this operation is applicable to liquid crystal display devices conforming with alternating-current drive, such as data signal line-inversion drive, in addition to liquid crystal display devices conforming with dot-inversion drive or scanning signal line inversion drive.

<8. Operation of the Liquid Crystal Display Device with the Power Circuit being Forcibly Shut Off>

Figure 20:
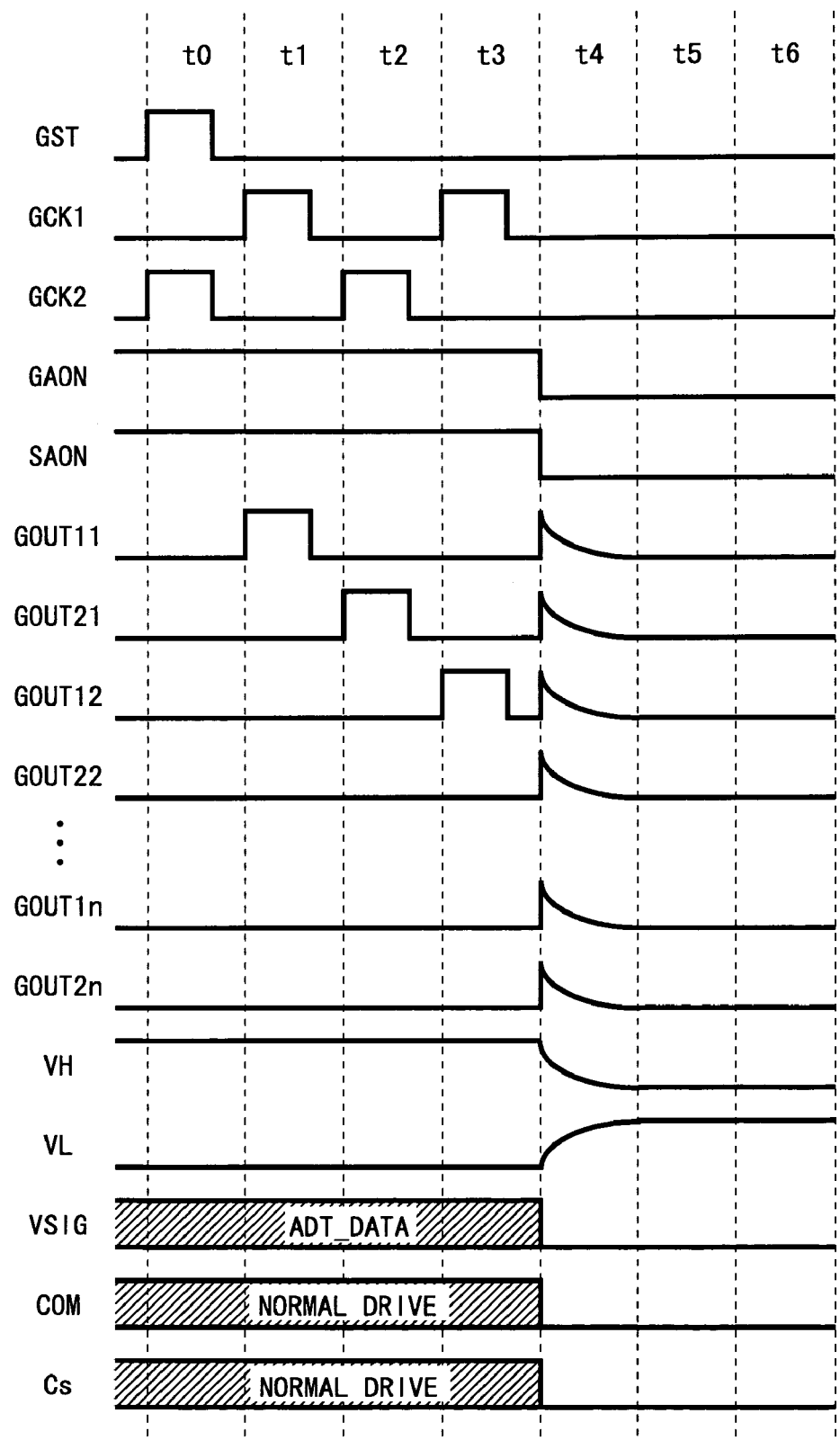
FIG. 20 is a timing chart for the liquid crystal display device shown in FIG. 16 where the power is forcibly shut off.
Figure 21:
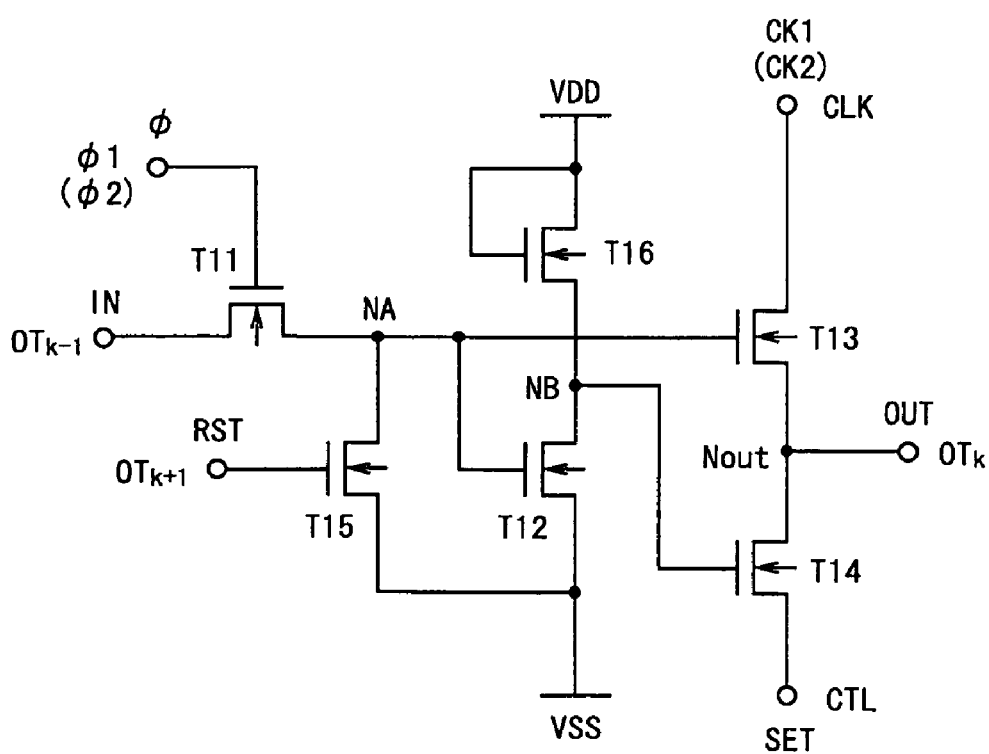
FIG. 21 is a circuit diagram illustrating the configuration of a conventional shift register.

A description will be given regarding a case where the power circuit 136 of the liquid crystal display device 130 is forcibly shut off (the turn-off not being intended by the viewer) when the display portion 131 of the liquid crystal display device 130 displays video. FIG. 20 is a timing chart where the power circuit 136 of the liquid crystal display device 130 is forcibly shut off during normal operation. In this case, the capacitive element 137 is connected at one terminal to the output terminal of the power circuit 136, and is grounded at the other terminal.

As shown in FIG. 20, the scanning signal line driver circuit 133 performs normal operation from period $t_0$ to period $t_3$. In this case, both of the all-on control signals GAON and SAON are set at high level (inactive).

When the power circuit 136 is forcibly shut off at the start point of period $t_4$, the all-on control signals GAON and SAON are simultaneously set to low level (active). As a result, the scanning signal line driver circuit 133 starts all-on operation, thereby outputting high-level output signals $GOUT_{11}$ to $GOUT_{1n}$ to scanning signal line $G_1$ to $G_n$, respectively. Similarly, the data signal line driver circuit 134 also starts all-on operation, thereby outputting high-level output signals (not shown) to the data signal lines $S_1$ to $S_n$.

However, due to the capacitive element 137 connected to the output terminal of the power circuit 136, the power-supply voltages VH and VL are not set to low level instantaneously, gradually falling to low level at the end point of period $t_4$ in accordance with a time constant determined by the capacitive element 137. Accordingly, as with the power-supply voltage VH, the output signals $GOUT_{11}$ to $GOUT_{1n}$ from the scanning signal line driver circuit 133 and the output signal from the data signal line driver circuit 134 gradually fall from high level to low level at the end point of period $t_4$. In this case also, the same effect can be achieved as the aforementioned effect achieved in the case where the power circuit 136 is turned off. Although not shown, the output signals $GOUT_{21}$ to $GOUT_{2n}$ change in the same manner as the output signals $GOUT_{11}$ to $GOUT_{1n}$, respectively, during normal operation, whereas they fall to low level during all-on operation.

INDUSTRIAL APPLICABILITY

The present invention is applicable to shift registers operating based on two-phase clock signals using transistors of the same conductivity type, and is particularly suitable for driver circuits or suchlike of display devices and imaging devices.

The invention claimed is:

1. A shift register configured by connecting unit circuits in multiple stages and operating based on two-phase clock signals, including first and second clock signals, the unit circuits being configured by transistors of the same conductivity type, wherein,
each of the unit circuits includes
a first output terminal for externally outputting a first output signal;
a second output terminal for outputting a second output signal to an input terminal of a subsequent-stage unit circuit;
a first output signal generation circuit for outputting either a first on-voltage or first off-voltage to the first output terminal as the first output signal;
a second output signal generation circuit for outputting either a second on-voltage or second off-voltage to the second output terminal as the second output signal; and
an all-on output signal generation circuit for outputting third on-voltage to the first output terminal as the first output signal,
wherein the unit circuit is configured such that when an active all-on control signal is provided to the unit circuit, the first output signal generation circuit stops outputting the first on-voltage as the first output signal at the same time as the all-on output signal generation circuit outputs the third on-voltage to the first output terminal as the first output signal and the second output signal generation circuit outputs the second off-voltage to the second output terminal as the second output signal,
wherein the first output signal generation circuit includes
a first output control transistor configured such that the first clock signal is provided to a first conducting terminal of the first output control transistor, and a second conducting terminal of the first output control transistor is connected to the first output terminal; and
a first output reset transistor configured such that a first conducting terminal of the first output reset transistor is connected to the second conducting terminal of the first output control transistor, and a third off-voltage is provided to a second conducting terminal of the first output reset transistor,
wherein the second output signal generation circuit includes
a second output control transistor configured such that the first clock signal is provided to a first conducting terminal of the second output control transistor, and a second conducting terminal of the second output control transistor is connected to the second output terminal; and
a second output reset transistor configured such that a first conducting terminal of the second output reset transistor is connected to the second conducting terminal of the second output control transistor, and a fourth off-voltage is provided to a second conducting terminal of the second output reset transistor,
wherein the all-on output signal generation circuit includes a third output control transistor configured such that a fourth on-voltage is provided to a first conducting terminal of the all-on output signal generation circuit, and a second conducting terminal of the all-on output signal generation circuit is connected to the first output terminal, and
wherein the unit circuit is configured such that when the active all-on control signal is provided to the unit circuit, the first and second output control transistors and the first output reset transistor are each brought into off-state, and the second output reset transistor and the third output control transistor are each brought into on-state.

2. The shift register according to claim 1, further comprising:
a reset signal output transistor configured such that a fifth on-voltage is provided to a first conducting terminal of the reset signal output transistor, the all-on control signal is provided to a control terminal of the reset signal output transistor, and a reset signal from a second conducting terminal of the reset signal output transistor is provided to the control terminal of the second output reset transistor as a reset signal; and
a discharge circuit for providing a fifth off-voltage to control terminals of the first and second output control transistors while the second output reset transistor in brought into an on-state by the reset signal.

3. The shift register according to claim 1, further comprising:
a reset signal generation circuit for generating a reset signal such that the reset signal is a fifth on-voltage when the second output signal from a previous-stage unit circuit is the second off-voltage and the reset signal is a fifth off-voltage when the second output signal from the previous-stage unit circuit transitions to the second on-voltage;
a discharge circuit for providing a sixth off-voltage to control terminals of the first and second output control transistors while the reset signal is the fifth on-voltage;
a reset signal block transistor configured such that a signal inverted from the all-on control signal is provided to a control terminal of the reset signal block transistor, a first conducting terminal of the reset signal block transistor is connected to the reset signal generation circuit, and a second conducting terminal of the reset signal block transistor is connected to the control terminal of the first output reset transistor; and
an off-voltage supply transistor configured such that the all-on control signal is provided to a control terminal of the off-voltage supply transistor, a seventh off-voltage is provided to a first conducting terminal of the off-voltage supply transistor, and a second conducting terminal is connected to the control terminal of the first output reset transistor.

4. The shift register according to claim 1, wherein the unit circuit further includes an input signal control circuit for, upon reception of the active all-on control signal, blocking an input signal provided by a previous-stage unit circuit and providing a fifth off-voltage to an input terminal of the unit circuit for receiving the input signal.

5. The shift register according to claim 1, further comprising:
   a reset signal generation circuit for generating a reset signal such that the reset signal is a fifth on-voltage when the second output signal from a previous-stage unit circuit is the second off-voltage and to the reset signal is a fifth off-voltage when the second output signal from the previous-stage unit circuit transitions to the second on-voltage; and
   a discharge circuit for providing a sixth off-voltage to control terminals of the first and second output control transistors while the reset signal is the fifth on-voltage, wherein,
   the reset signal generation circuit includes
      a resistive element configured such that a sixth on-voltage being provided to a first terminal of the resistive element;
      a first transistor configured such that the second clock signal is provided to a control terminal of the first transistor, and a first conducting terminal of the first transistor is connected to a second terminal of the resistive element; and
      a second transistor configured such that an input signal from the previous-stage unit circuit is provided to a control terminal of the second transistor, a first conducting terminal of the second transistor is connected to the second conducting terminal of the first transistor, and a seventh off-voltage is provided to a second conducting terminal of the second transistor, and
   the reset signal generation circuit is configured to output a voltage at a connection point between the first transistor and the second transistor as the reset signal.

6. A display device comprising a plurality of two-dimensionally arranged display elements and a driver circuit including the shift register of claim 1, wherein the display elements and the shift register include transistors of the same conductivity type.

7. An active-matrix display device for providing video to be displayed, comprising:
   a display portion including a plurality of scanning signal lines, a plurality of data signal lines crossing the scanning signal lines, and a plurality of display elements arranged in a matrix at their corresponding intersections of the scanning signal lines and the data signal lines;
   a scanning signal line driver circuit including the shift register of claim 1, the scanning signal line driver circuit being configured to selectively activate the scanning signal lines;
   a video signal line for transmitting a video signal for the video to be displayed to the display portion;
   a data signal line driver circuit for outputting a data signal to the data signal lines based on the video signal transmitted by the video signal line; and
   a power circuit for supplying a power-supply voltage to the scanning signal line driver circuit and the data signal line driver circuit, wherein,
   the scanning signal line driver circuit is configured such that when the power circuit is turned on, an active all-on control signal is provided to the scanning signal line driver circuit, thereby activating all the scanning signal lines.

8. The display device according to claim 7, wherein,
   the data signal line driver circuit includes a first shift register, and
   the data signal line driver circuit is configured such that when the power circuit is turned on, the active all-on control signal is provided to the data signal line driver circuit, thereby providing an equal voltage to all the data signal lines.

9. The display device according to claim 7, wherein,
   the data signal line driver circuit further includes a first shift register and a plurality of switching elements connecting the video signal line to each of the data signal lines, and
   the data signal line driver is configured such that when the power circuit is turned off, the active all-on control signal is provided to the data signal line driver circuit, thereby turning off all the switching elements.

10. The display device according to claim 7, wherein,
    the data signal line driver circuit further includes a first shift register and a plurality of switching elements connecting the video signal line to each of the data signal lines, and
    the data signal line driver circuit is configured such that when the power circuit is turned off, the active all-on control signal is provided to the data signal line driver circuit, thereby turning on all the switching elements.

11. The display device according to claim 7, wherein a capacitative element is connected between an output terminal of the power circuit and a ground terminal.

* * * * *